US010959331B2

(12) United States Patent
Sunshine et al.

(10) Patent No.: US 10,959,331 B2
(45) Date of Patent: *Mar. 23, 2021

(54) ELECTRICAL COMPONENTS ATTACHED TO FABRIC

(71) Applicant: Apple Inc., Cupertino, CA (US)

(72) Inventors: Daniel D. Sunshine, Sunnyvale, CA (US); David M. Kindlon, Felton, CA (US); Michael B. Nussbaum, Santa Cruz, CA (US); Andrew L. Rosenberg, Sunnyvale, CA (US); Andrew Sterian, Morgan Hill, CA (US); Breton M. Saunders, Los Gatos, CA (US); Christopher A. Schultz, San Francisco, CA (US); David A. Bolt, Scotts Valley, CA (US); Mark J. Beesley, Carmel Valley, CA (US); Peter W. Mash, San Bruno, CA (US); Steven Keating, Sunnyvale, CA (US); Chang Liu, San Francisco, CA (US); Lan Hoang, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/914,131

(22) Filed: Jun. 26, 2020

(65) Prior Publication Data
US 2020/0329559 A1 Oct. 15, 2020

Related U.S. Application Data

(63) Continuation of application No. 16/685,846, filed on Nov. 15, 2019, now Pat. No. 10,701,802, which is a (Continued)

(51) Int. Cl.
*H05K 1/00* (2006.01)
*H05K 1/03* (2006.01)
(Continued)

(52) U.S. Cl.
CPC .............. *H05K 1/038* (2013.01); *A41D 1/002* (2013.01); *D03D 1/0088* (2013.01);
(Continued)

(58) Field of Classification Search
USPC ......................................................... 361/749
See application file for complete search history.

(56) References Cited

U.S. PATENT DOCUMENTS

2003/0211797 A1* 11/2003 Hill ........................ H05K 1/189
442/205
2004/0184219 A1 9/2004 Otsuka et al.
(Continued)

FOREIGN PATENT DOCUMENTS

EP 2610919 7/2013

OTHER PUBLICATIONS

Annett Dörfel et al: "Entwicklung von Losungen zum Einweben von Inserts auf Band- und Breitwebmaschinen für Smart Textiles und Automobiltextilien" Jan. 13, 2011 (Jan. 13, 2011), XP055112401, Retrieved from the Internet: URL:http://tu-dresden.de/die_tu_dresden/fakultaeten/fakultaetmaschinenwesen/itm/forschung/forschungsthemen/inserts/i ndex_html [retrieved on Apr. 7, 2014] p. 2, paragraph 4-p. 6, paragraph 1.

(Continued)

*Primary Examiner* — Andargie M Aychillhum
(74) *Attorney, Agent, or Firm* — Treyz Law Group, P.C.; Kendall W. Abbasi

(57) ABSTRACT

An item may include fabric having insulating and conductive yarns or other strands of material. The conductive strands may form signal paths. Electrical components can be mounted to the fabric. Each electrical component may have an electrical device such as a semiconductor die that is mounted on an interposer substrate. The interposer may have contacts that are soldered to the conductive strands. A (Continued)

protective cover may encapsulate portions of the electrical component. To create a robust connection between the electrical component and the fabric, the conductive strands may be threaded through recesses in the electrical component. The recesses may be formed in the interposer or may be formed in a protective cover on the interposer. Conductive material in the recess may be used to electrically and/or mechanically connect the conductive strand to a bond pad in the recess. Thermoplastic material may be used to seal the solder joint.

20 Claims, 21 Drawing Sheets

Related U.S. Application Data continuation of application No. 15/439,641, filed on Feb. 22, 2017, now Pat. No. 10,485,103.

(60) Provisional application No. 62/298,050, filed on Feb. 22, 2016.

(51) Int. Cl.
| H05K 1/18 | (2006.01) |
| H05K 1/11 | (2006.01) |
| H01L 23/31 | (2006.01) |
| H01L 23/498 | (2006.01) |
| H05K 1/02 | (2006.01) |
| D03D 1/00 | (2006.01) |
| A41D 1/00 | (2018.01) |

(52) U.S. Cl.
CPC ...... *H01L 23/3121* (2013.01); *H01L 23/4985* (2013.01); *H01L 23/49822* (2013.01); *H01L 23/49833* (2013.01); *H01L 23/49838* (2013.01); *H05K 1/0281* (2013.01); *H05K 1/111* (2013.01); *H05K 1/189* (2013.01); *H05K 2201/0129* (2013.01); *H05K 2201/0969* (2013.01); *H05K 2201/1053* (2013.01); *H05K 2201/10378* (2013.01); *H05K 2201/10984* (2013.01)

(56) References Cited

U.S. PATENT DOCUMENTS

| 2009/0200066 A1 | 8/2009 | Vicard et al. |
| 2012/0199958 A1 | 8/2012 | Horibe et al. |
| 2013/0033879 A1 | 2/2013 | Vicard et al. |
| 2014/0045290 A1 | 2/2014 | Horimoto et al. |
| 2017/0251555 A1 | 8/2017 | Sunshine et al. |
| 2019/0013274 A1 | 1/2019 | Sunshine et al. |

OTHER PUBLICATIONS

C. Kallmayer et al., "Large Area Sensor Integration in Textiles" System Integration and Interconnection Technologies, IEEE, International Multi-Conference on Systems, Sygnals & Devices, Chemnitz, 2012, pp. 1-5. doi: 10.1109/SSD.2012.6198112.

Dorfel, "Development of Solutions for Inserting Inserts on Ribbon Loom and Wide-Weaving Machines for Smart Fabrics and Automobile Fabrics", Institute for Textile Machinery and Textiles High Performance Materials Technology at TU [Technical University] Dresden (ITM), Jan. 13, 2011.

* cited by examiner

ELECTRICAL COMPONENTS ATTACHED TO FABRIC

This application is a continuation of U.S. patent application Ser. No. 16/685,846, filed Nov. 15, 2019, which is a continuation of U.S. patent application Ser. No. 15/439,641, filed Feb. 22, 2017, which claims the benefit of U.S. provisional patent application No. 62/298,050, filed on Feb. 22, 2016, all of which are hereby incorporated by reference herein in their entireties.

FIELD

This relates generally to items with fabric and, more particularly, to items with fabric and electrical components.

BACKGROUND

It may be desirable to form bags, furniture, clothing, and other items from materials such as fabric. Fabric items generally do not include electrical components. It may be desirable, however, to incorporate electrical components into fabric to provide a user of a fabric item with enhanced functionality.

It can be challenging to incorporate electrical components into fabric. Fabric is flexible, so it can be difficult to mount structures to fabric. Electrical components must be coupled to signal paths (e.g., signal paths that carry data signals, power, etc.), but unless care is taken, signal paths will be damaged or components may become dislodged as fabric is bent and stretched.

It would therefore be desirable to be able to provide improved techniques for incorporating electrical components into items with fabric.

SUMMARY

An item may include fabric such as woven fabric having insulating and conductive yarns or other strands of material. The conductive yarns may form signal paths (e.g., signal paths that carry data signals, control signals, power, etc.). Electrical components can be embedded within pockets in the fabric and may be electrically coupled to the signal paths.

Each electrical component may have an electrical device such as a semiconductor die that is mounted on an interposer. The electrical device may be a light-emitting diode, a sensor, an actuator, or other electrical device. The electrical device may have contacts that are soldered to contacts on the interposer. The interposer may have additional contacts that are soldered to the signal paths. Metal traces in the interposer may convey signals (e.g., data signals, control signals, power, etc.) between the contacts to which the electrical device is coupled and the contacts to which the conductive strands are coupled.

The interposer may be formed from a printed circuit such as a rigid printed circuit substrate layer or a flexible printed circuit substrate layer, or may be formed from both rigid and flexible printed circuit substrate layers.

To create a robust connection between the electrical component and the fabric, the conductive strands may be threaded through recesses, trenches, or openings in the component. The recesses, trenches, or openings may be formed in the electrical device itself, in the interposer to which the electrical device is mounted, or a protective cover that encapsulates portions of the electrical device and interposer. Conductive material in the recess may be used to electrically and mechanically connect the conductive strand to a bond pad in the recess.

In arrangements where strands are threaded through an interposer, a recess may be formed from a gap between upper and lower substrates in the interposer or from a notch that extends from an upper surface to a lower surface of the interposer.

In arrangements where strands are threaded through a protective cover, a trench may be formed from a gap between upper and lower protective covers or from a notch that extends from one edge of the protective cover to an opposing edge of the protective cover. The notch may have locally widened portions to help prevent the solder from shifting off of the bond pad in the trench. The trench may have straight or sloped sidewalls.

Thermoplastic material may be formed in the trenches. Heat may be applied to reflow solder in the trench and melt the thermoplastic material. Once cooled and hardened, the solder may form a secure electrical connection between the strand and the pad, while the thermoplastic may spread across the trench and provide a seal that protects the electrical connection from mechanical damage and environmental contaminants.

DETAILED DESCRIPTION

Figure 1:
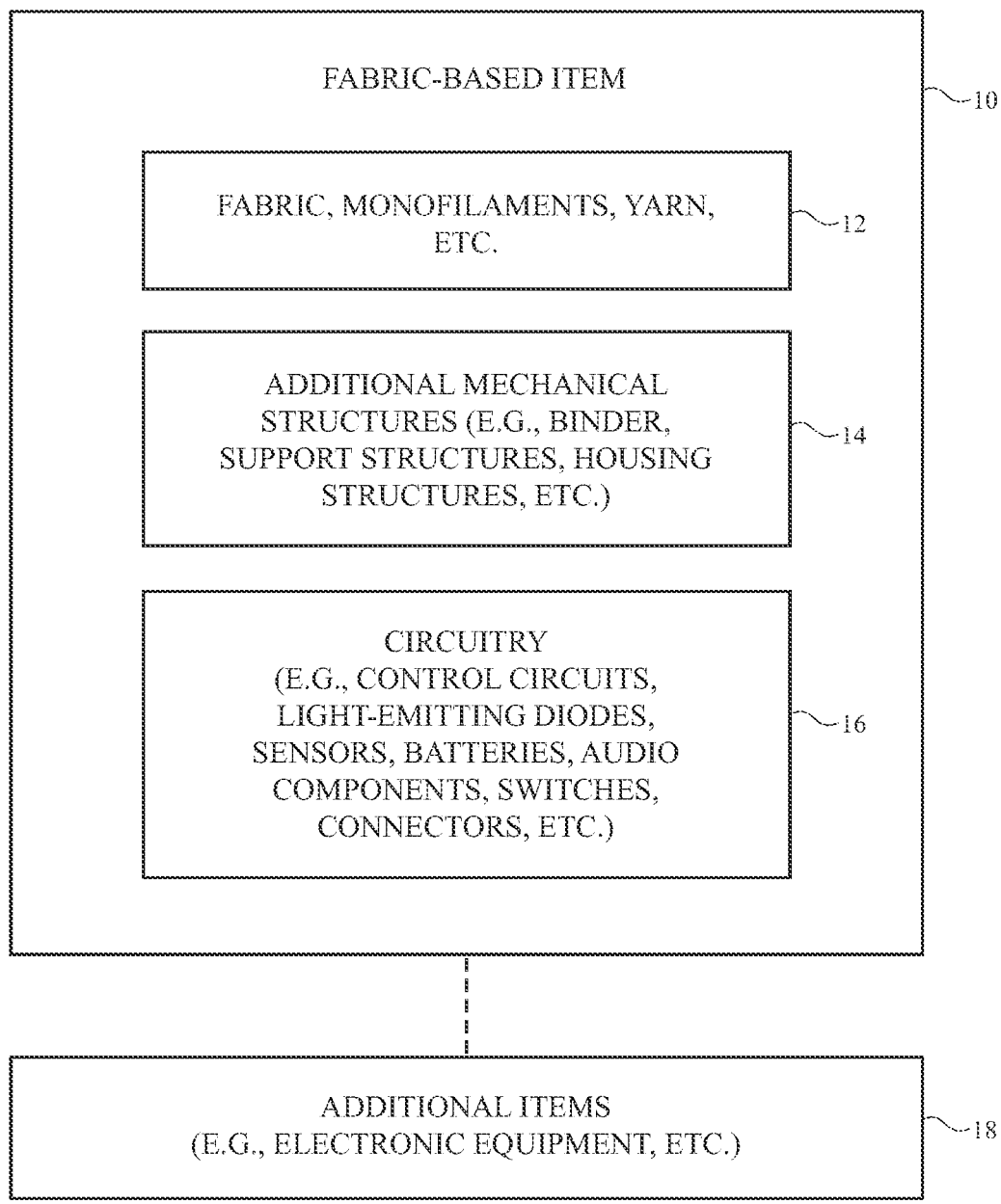
FIG. 1 is a schematic diagram of an illustrative fabric item in accordance with an embodiment.

Items such as item 10 of FIG. 1 may include fabric and may sometimes be referred to as a fabric item or fabric-based item. Item 10 may be an electronic device or an accessory for an electronic device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which fabric item 10 is mounted in a kiosk, in an automobile, airplane, or other vehicle (e.g., an autonomous or non-autonomous vehicle), other electronic equipment, or equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, etc.), or may be any other suitable item that incorporates fabric.

Item 10 may include intertwined strands of material such as monofilaments and yarns that form fabric 12. Fabric 12 may form all or part of a housing wall or other layer in an electronic device, may form internal structures in an electronic device, or may form other fabric-based structures. Item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

The strands of material in fabric 12 may be single-filament strands (sometimes referred to as fibers) or may be yarns or other strands that have been formed by intertwining multiple filaments of material together. Examples of fabric 12 formed from yarn are sometimes described herein as an example. This is, however, merely illustrative. Yarn-based fabric for item 10 may, if desired, be partly or completely formed from monofilaments.

The yarns in fabric 12 may be formed from polymer, metal, glass, graphite, ceramic, natural materials as cotton or bamboo, or other organic and/or inorganic materials and combinations of these materials. Conductive coatings such as metal coatings may be formed on non-conductive material. For example, plastic yarns and monofilaments in fabric 12 may be coated with metal to make them conductive. Reflective coatings such as metal coatings may be applied to make yarns and monofilaments reflective. Yarns may be formed from a bundle of bare metal wires or metal wire intertwined with insulating monofilaments (as examples).

Yarn may be intertwined to form fabric 12 using intertwining equipment such as weaving equipment, knitting equipment, or braiding equipment. Intertwined yarn may, for example, form woven fabric. Conductive yarn and insulating yarn may be woven, knit, braided, or otherwise intertwined to form contact pads that can be electrically coupled to conductive structures in item 10 such as the contact pads of an electrical component.

Conductive yarn and insulating yarn may also be woven, knit, or otherwise intertwined to form conductive paths. The conductive paths may be used in forming signal paths (e.g., signal buses, power lines for carrying power, etc.), may be used in forming part of a capacitive touch sensor electrode, a resistive touch sensor electrode, or other input-output device, or may be used in forming other patterned conductive structures. Conductive structures in fabric 12 may be used in carrying electrical current such as power, digital signals, analog signals, sensor signals, control signals, data, input signals, output signals, or other suitable electrical signals.

Item 10 may include additional mechanical structures 14 such as polymer binder to hold yarns in fabric 12 together, support structures such as frame members, housing structures (e.g., an electronic device housing), and other mechanical structures.

To enhance mechanical robustness and electrical conductivity at yarn-to-yarn connections, additional structures and materials (e.g., solder, crimped metal connections, welds, conductive adhesive such as anisotropic conductive film and other conductive adhesive, non-conductive adhesive, fasteners, etc.) may be used to help form yarn-to-yarn connections. These yarn-to-yarn connections may be formed where yarns cross each other perpendicularly or at other yarn intersections where connections are desired. Insulating material can be interposed between intersecting conductive yarns at locations in which it is not desired to form a yarn-to-yarn connection. The insulating material may be plastic or other dielectric, may include an insulating yarn or a conductive yarn with an insulating coating or insulated conductive monofilaments, etc. Solder connections may be formed between conductive yarns by melting solder so that the solder flows over conductive yarns. The solder may be melted using an inductive soldering head to heat the solder, using a reflow oven to heat the solder, using a laser or hot bar to heat the solder, or using other soldering equipment. During soldering, outer dielectric coating layers (e.g., outer polymer layers) may be melted away in the presence of molten solder, thereby allowing underlying metal yarns to be soldered together.

Circuitry 16 may be included in item 10. Circuitry 16 may include electrical components that are coupled to fabric 12, electrical components that are housed within an enclosure formed by fabric 12, electrical components that are attached to fabric 12 using welds, solder joints, adhesive bonds (e.g., conductive adhesive bonds such as anisotropic conductive adhesive bonds or other conductive adhesive bonds), crimped connections, or other electrical and/or mechanical bonds. Circuitry 16 may include metal structures for carrying current, electrical components such as integrated circuits, light-emitting diodes, sensors, and other electrical devices. Control circuitry in circuitry 16 may be used to control the operation of item 10 and/or to support communications with item 18 and/or other devices.

Item 10 may interact with electronic equipment or other additional items 18. Items 18 may be attached to item 10 or item 10 and item 18 may be separate items that are configured to operate with each other (e.g., when one item is a case and the other is a device that fits within the case, etc.). Circuitry 16 may include antennas and other structures for supporting wireless communications with item 18. Item 18 may also interact with item 10 using a wired communications link or other connection that allows information to be exchanged.

In some situations, item 18 may be an electronic device such as a cellular telephone, computer, or other portable electronic device and item 10 may form a cover, case, bag, or other structure that receives the electronic device in a pocket, an interior cavity, or other portion of item 10. In other situations, item 18 may be a wrist-watch device or other electronic device and item 10 may be a strap or other fabric item that is attached to item 18 (e.g., item 10 and item 18 may together form a fabric-based item such as a wrist-watch with a strap). In still other situations, item 10 may be an electronic device, fabric 12 may be used in forming the electronic device, and additional items 18 may include accessories or other devices that interact with item 10. Signal paths formed from conductive yarns and monofilaments may be used to route signals in item 10 and/or item(s) 18.

The fabric that makes up item 10 may be formed from yarns and/or monofilaments that are intertwined using any suitable intertwining equipment. With one suitable arrangement, which may sometimes be described herein as an example, fabric 12 may be woven fabric formed using a weaving machine. In this type of illustrative configuration, fabric may have a plain weave, a basket weave, a satin weave, a twill weave, or variations of these weaves, may be a three-dimensional woven fabric, or may be other suitable fabric.

Figure 2:
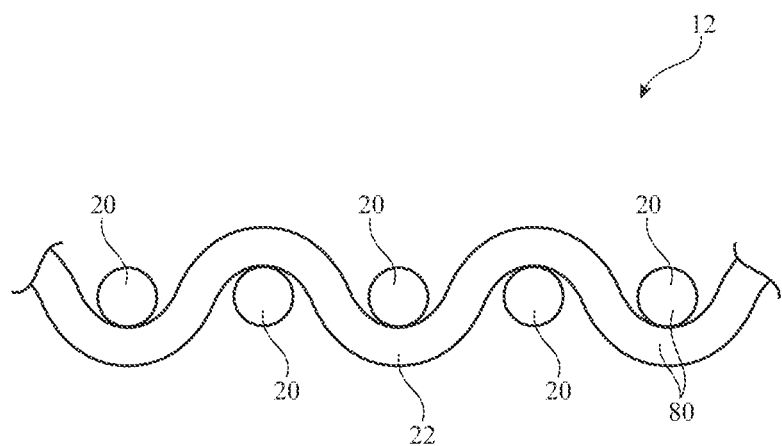
FIG. 2 is a side view of illustrative fabric in accordance with an embodiment.

A cross-sectional side view of illustrative woven fabric 12 is shown in FIG. 2. As shown in FIG. 2, fabric 12 may include yarns or other strands of material 80. Strands 80 may include warp strands 20 and weft strands 22. If desired, additional strands that are neither warp nor weft strands may be incorporated into fabric 12. The example of FIG. 2 is merely illustrative. In the illustrative configuration of FIG. 2, fabric 12 has a single layer of woven strands 80. Multi-layer fabric constructions may be used for fabric 12 if desired.

Figure 3:
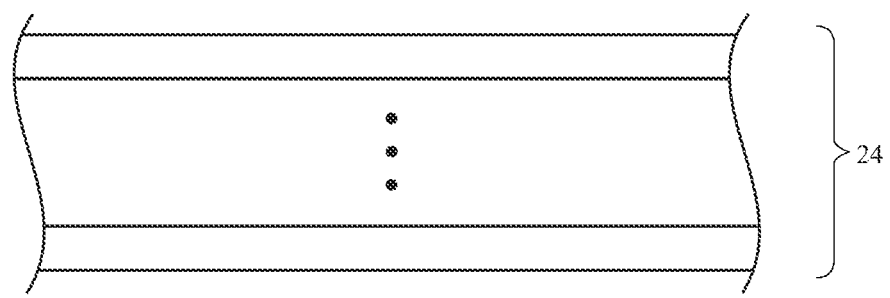
FIG. 3 is a side view of layers of material that may be incorporated into a fabric item in accordance with an embodiment.

Item 10 may include non-fabric materials (e.g., structures formed from plastic, metal, glass, ceramic, crystalline materials such as sapphire, etc.). These materials may be formed using molding operations, extrusion, machining, laser processing, and other fabrication techniques. In some configurations, some or all of item 10 may include one or more layers of material such as layers 24 of FIG. 3. Layers 24 may include layers of polymer, metal, glass, fabric, adhesive, crystalline materials, ceramic, substrates on which components have been mounted, patterned layers of material, layers of material containing patterned metal traces, thin-film devices such as transistors, and/or other layers.

Figure 4:
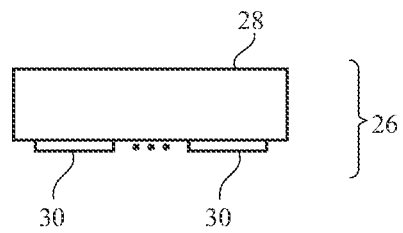
FIG. 4 is a cross-sectional side view of an illustrative electrical component in accordance with an embodiment.

A side view of an illustrative electrical component of the type that may be used in item 10 is shown in FIG. 4. Electrical components in item 10 such as illustrative electrical component 26 of FIG. 4 may include discrete electrical components such as resistors, capacitors, and inductors, may include connectors, may include batteries, may include input-output devices such as switches, buttons, light-emitting components such as light-emitting diodes, audio components such as microphones and speakers, vibrators (e.g., piezoelectric actuators that can vibrate), solenoids, electromechanical actuators, motors, and other electromechanical devices, microelectromechanical systems (MEMs) devices, pressure sensors, light detectors, proximity sensors (light-based proximity sensors, capacitive proximity sensors, etc.), force sensors (e.g., piezoelectric force sensors), strain gauges, moisture sensors, temperature sensors, accelerometers, gyroscopes, compasses, magnetic sensors (e.g., Hall effect sensors and magnetoresistance sensors such as giant magnetoresistance sensors), touch sensors, and other sensors, components that form displays, touch sensors arrays (e.g., arrays of capacitive touch sensor electrodes to form a touch sensor that detects touch events in two dimensions), and other input-output devices, electrical components that form control circuitry such as non-volatile and volatile memory, microprocessors, application-specific integrated circuits, system-on-chip devices, baseband processors, wired and wireless communications circuitry, and other integrated circuits.

Electrical components such as component 26 may be bare semiconductor dies (e.g., laser dies, light-emitting diode dies, integrated circuits, etc.) or packaged components (e.g. semiconductor dies or other devices packaged within plastic packages, ceramic packages, or other packaging structures). One or more electrical terminals such as contact pads 30 may be formed on body 28 of component 26. Body 28 may be a semiconductor die (e.g., a laser die, light-emitting diode die, integrated circuit, etc.) or may be a package for a component (e.g., a plastic package or other dielectric package that contains one or more semiconductor dies or other electrical devices). Contacts for body 28 such as pads 30 may be protruding leads, may be planar contacts, may be formed in an array, may be formed on any suitable surfaces of body 28, or may be any other suitable contacts for forming electrical connections to component 26. For example, pads 30 may be metal solder pads.

Figure 5:
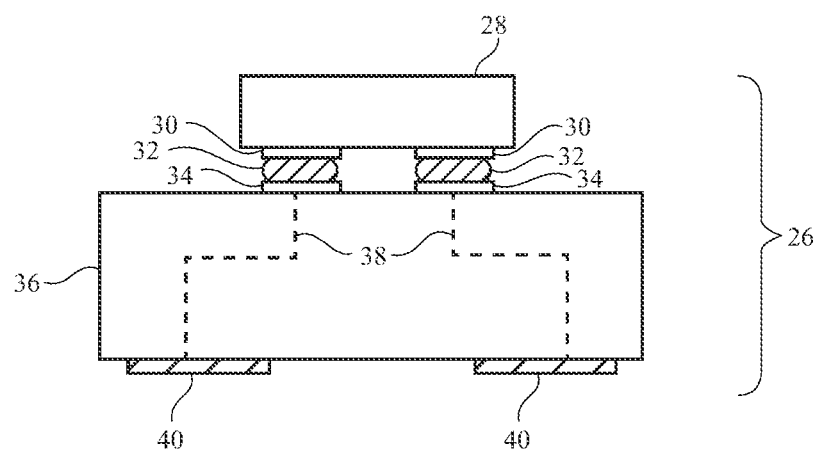
FIG. 5 is a cross-sectional side view of an illustrative electrical component having an electrical device mounted on an interposer in accordance with an embodiment.

As shown in the example of FIG. 5, body 28 may be mounted on a support structure such as interposer 36. Interposer 36 may be a printed circuit, ceramic carrier, or other dielectric substrate. Interposer 36 may be larger than body 28 or may have other suitable sizes. Interposer 36 may have a planar shape with a thickness of 700 microns, more than 500 microns, less than 500 microns, or other suitable thickness. The thickness of body 28 may be 500 microns, more than 300 microns, less than 1000 microns, or other suitable thickness. The footprint (area viewed from above) of body 28 and interposer 36 may be 10 microns×10 microns, 100 microns×100 microns, more than 1 mm×1 mm, less than 10 mm×10 mm, may be rectangular, may be square, may have L-shapes, or may have other suitable shapes and sizes.

Interposer 36 may contain signal paths such as metal traces 38. Metal traces 38 may have portions forming contacts such as pads 34 and 40. Pads 34 and 40 may be formed on the upper surface of interposer 36, on the lower surface of interposer 36, or on the sides of interposer 36. Conductive material such as conductive material 32 may be used in mounting body 28 to interposer 36. Conductive material 32 may be solder (e.g., low temperature or high temperature solder), may be conductive adhesive (isotropic conductive adhesive or anisotropic conductive film), may be formed during welding, or may be other conductive material for coupling electrical device pads (body pads) such as pads 30 on body 28 to interposer pads 34. Metal traces 38 in interposer 36 may couple pads 34 to other pads such as pads 40. If desired, pads 40 may be larger and/or more widely spaced than pads 34, thereby facilitating attachment of interposer 36 to conductive yarns and/or other conductive paths in item 10. Solder, conductive adhesive, or other conductive connections may be used in coupling pads 40 to conductive yarn, conductive monofilament, printed circuit traces, or other conductive path materials in item 10.

Figure 6:
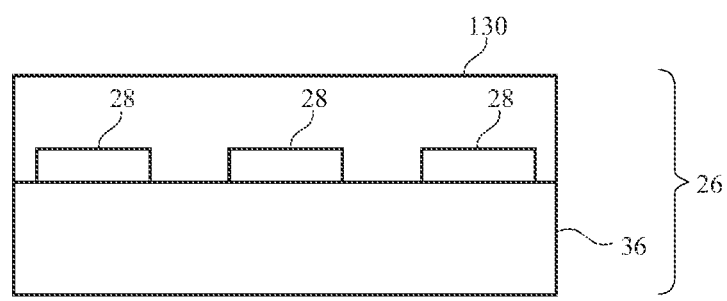
FIG. 6 is a cross-sectional side view of an illustrative electrical component having multiple electrical devices mounted on an interposer in accordance with an embodiment.

FIG. 6 shows an example in which component 26 includes a protective structure such as protective structure 130 on interposer 36. Protective structure 130 may, for example, be a plastic structure that completely or partially encapsulates devices 28 and interposer 36 to provide mechanical robustness, protection from moisture and other environmental contaminants, heat sinking, and/or electrical insulation. Protective structure 130 may be formed from molded plastic (e.g., injection-molded plastic, transfer molded plastic, low-pressure molded plastic, two-part molded plastic, etc.) that has been molded over devices 28 and interposer 36 or that is pre-formed into the desired shape and subsequently attached to interposer 36, may be a layer of polymer such as polyimide that has been cut or machined into the desired shape and subsequently attached to interposer 36, or may be formed using other suitable methods. Illustrative materials that may be used to form protective structure 130 include epoxy, polyamide, polyurethane, silicone, other suitable materials, or a combination of any two or more of these materials. Protective structure 130 may be formed on one or both sides of interposer 36 (e.g., may completely or partially surround interposer 36).

Protective structure 130 may be entirely opaque, may be entirely transparent, or may have both opaque and transparent regions. Transparent portions of protective structure 130 may allow light emitted from one or more devices 28 to be transmitted through protective structure 130 and/or may allow external light to reach (and be detected by) one or more devices 28. Protective cover 130 may, if desired, have different thicknesses. The example of FIG. 6 in which protective cover 130 has uniform thickness across interposer 36 is merely illustrative.

If desired, interposer 36 may be sufficiently large to accommodate multiple electrical devices each with a respective body 28. For example, multiple light-emitting diodes, sensors, and/or other electrical devices may be mounted to a common interposer such as interposer 36 of FIG. 6. The light-emitting diodes may be micro-light-emitting diodes (e.g., light-emitting diode semiconductor dies having footprints of about 10 microns×10 microns, more than 5 microns×5 microns, less than 100 microns×100 microns, or other suitable sizes). The light-emitting diodes may include light-emitting diodes of different colors (e.g., red, green, blue, white, etc.), infrared light, or ultraviolet light. Redundant light-emitting diodes or other redundant circuitry may be included on interposer 36. In configurations of the type shown in FIG. 6 in which multiple electrical devices (each with a respective body 28) are mounted on a common interposer, electrical component 26 may include any suitable combination of electrical devices (e.g., light-emitting diodes, sensors, integrated circuits, actuators, and/or other devices of the type described in connection with electrical component 26 of FIG. 4).

The examples of FIGS. 5 and 6 in which devices 28 are only located on one side of interposer 36 are merely illustrative. If desired, devices 28 may be mounted to both sides of interposer 36.

Electrical components may be coupled to fabric structures, individual yarns or monofilaments, printed circuits (e.g., rigid printed circuits formed from fiberglass-filled epoxy or other rigid printed circuit board material or flexible printed circuits formed from polyimide substrate layers or other sheets of flexible polymer materials), metal or plastic parts with signal traces, or other structures in item 10.

Figure 7:
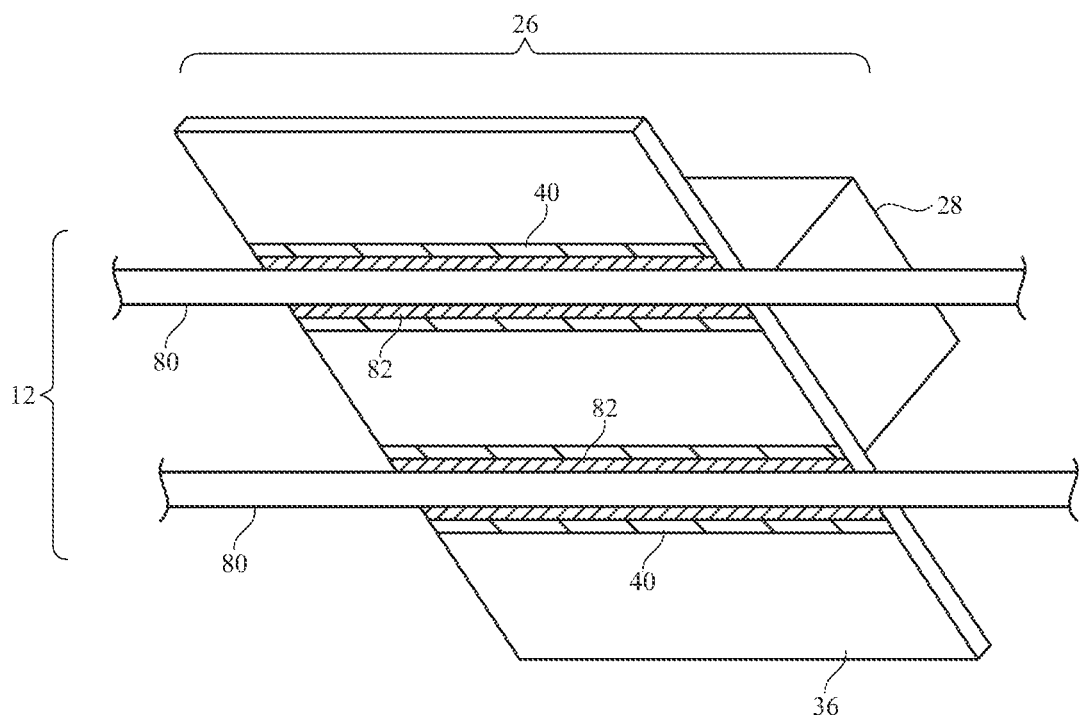
FIG. 7 is a perspective view of an illustrative electrical component mounted to conductive strands in accordance with an embodiment.

In some configurations, item 10 may include electrical connections between components 26 and conductive paths in fabric 12. Fabric 12 may include strands 80 (e.g., conductive yarns and/or conductive monofilaments) for carrying electrical current (e.g., power, digital signals, analog signals, sensor signals, control signals, data, input signals, output signals, or other suitable electrical signals) to and/or from components 26. The strands may be used to form fabric contact pads. Consider, as an example, fabric 12 of FIG. 7. As shown in FIG. 7, fabric 12 may contain strands 80. Strands 80 may be warp strands, weft strands, or other suitable strands in fabric 12. One or more of strands 80 may be conductive and may form a contact pad. Component 26 may have contact pads such as pad 40. Solder or other conductive material 82 may be used to couple pads 40 to the pads formed by strands 80. In the example of FIG. 7, pads 40 are formed on a lower surface of interposer 36 (e.g., a surface that is opposite the surface on which component 28 is mounted). Conductive material 82 may be used to electrically and mechanically couple component 26 to strands 80 of fabric 12.

In the example of FIG. 7, pads 40 are formed from elongated strips of conductive material (e.g., metal) that extend from one edge of interposer 36 to an opposing edge of interposer 36. This provides a large area with which to form a mechanical and electrical connection between interposer 36 and strands 80. As shown in FIG. 7, each strand 80 extends parallel to one of pads 40. The elongated shape of pads 40 allows conductive material 82 to attach a longer portion of strand 80 to pad 40. The connection between pad 40 and strand 80 may, for example, span across the width of interposer 36, thereby providing a robust connection between interposer 36 and strand 80.

In some configurations, it may be desirable to provide a more robust mechanical connection between component 26 (e.g., component 26 of FIGS. 4, 5, and 6) and fabric 12 to ensure that component 26 does not come loose when fabric 12 is bent or stretched. To increase the robustness of the connection between strands 80 and component 26, component 26 may have one or more recesses for receiving strands 80. For example, strands 80 may each be "threaded" through a portion of component 26 to help secure component 26 to fabric 12. Strands 80 may be threaded through portions (e.g., recesses, openings, trenches, etc.) of device 28, interposer 36, protective structure 130, and/or other portions of component 26. FIGS. 8-21 illustrate examples in which strands 80 are threaded through portions of interposer 36. FIGS. 22-43 illustrate examples in which strands 80 are threaded through portions of protective structure 130. It should be understood, however, that the geometries of interposer 36 (e.g., the location, shape, and size of recesses in interposer 36) and other features of FIGS. 8-21 may be applied to protective structure 130, and that the geometries of protective structure 130 (e.g., the location, shape, and size of recesses in protective structure 130) and other features of FIGS. 22-43 may be applied to interposer 36. In general, component 26 may have any combination of features shown in FIGS. 8-43.

Figure 8:
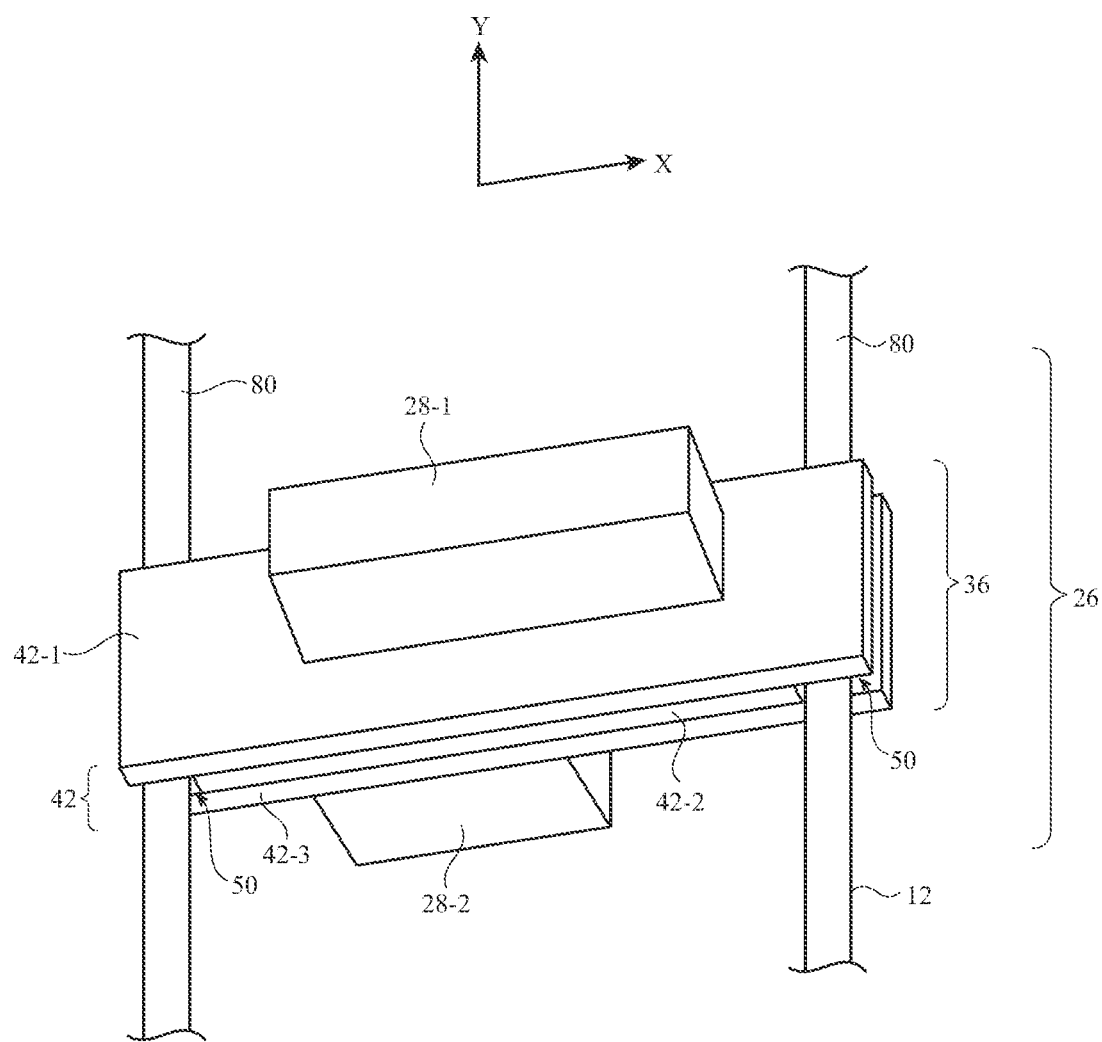
FIG. 8 is a perspective view of an illustrative electrical component having an interposer with recesses for receiving conductive strands in accordance with an embodiment.

As shown in FIG. 8, interposer 36 may have multiple layers such as layers 42. Interposer 36 may, for example, be a multi-layer printed circuit. Layers 42 may include flexible printed circuit layers, rigid printed circuit layers, or a combination of rigid and flexible printed circuit layers. Layers 42 of interposer 36 may include dielectric materials such as fiberglass-filled epoxy (e.g., as a rigid layer), polyimide (e.g., as a flexible layer), FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (woven glass and epoxy), CEM-4 (woven glass and epoxy), CEM-5 (woven glass and polyester), paper impregnated with phenolic resin, polystyrene, polyimide, polytetrafluoroethylene (PTFE), plastic, other polymers, ceramics, or other suitable dielectrics. Layers 42 may include attachment layers such as layers of prepreg (e.g., pre-impregnated layers of fiber and resin).

Layers 42 may contain metal traces (sometimes referred to as interconnects). The metal traces may include patterned signal lines and vias for routing signals between components that are mounted on interposer 36. The metal traces may include ground plane structures (e.g., blanket sections of metal traces that serve as ground). There may be any suitable number of metal layers in layers 42. For example, layers 42 may contain two layers of metal, three layers of metal, four layers of metal, more than four layers of metal, or fewer than four layers of metal. Metal layers in layers 42 may be formed from copper, silver, tungsten, other suitable metals, or a combination of any two or more of these metals.

As shown in FIG. 8, interposer 36 includes first layer 42-1, second layer 42-2 (sometimes referred to as a spacer layer), and third layer 42-3. In one illustrative arrangement, first layer 42-1 and third layer 42-3 are flexible printed circuits and second layer 42-2 is a rigid printed circuit. This is, however, merely illustrative. If desired, layers 42-1 and 42-3 may be rigid printed circuits and layer 42-2 may be a flexible printed circuit, all three layers may be flexible printed circuits, all three layers may be rigid printed circuits, or layers 42 may include any other suitable combination of rigid and flexible layers. Arrangements where upper layer 42-1 and lower layer 42-3 are flexible printed circuits and layer 42-2 is a rigid printed circuit are sometimes described herein as an illustrative example. In still other arrangements, one or more of layers 42 may not contain any circuitry. For example, layer 42-2 and layer 42-3 may be structural support layers that do not include any circuitry, if desired.

The example of FIG. 8 in which interposer 36 includes three printed circuit substrates 42-1, 42-2, and 42-3 is merely illustrative. If desired, interposer may include four printed circuit substrates, five printed circuit substrate, six or more printed circuit substrates, or less than three printed circuit substrates.

If desired, components may be mounted to one or both of the opposing surfaces of interposer 36. In the example of FIG. 8, one or more components such as component 28-1 is mounted to the upper surface of interposer 36 (e.g., the surface formed by upper layer 42-1) and one or more components such as component 28-2 is mounted to the opposing lower surface of interposer 36 (e.g., the surface formed by lower layer 42-3).

Interposer 36 may include recesses such as recesses 50. In the example of FIG. 8, interposer 36 includes a first recess 50 on one side of interposer 36 and a second recess 50 on an opposing side of interposer 36. Recesses 50 are formed where upper and lower layers 42-1 and 42-3 extend beyond the outer edge of middle layer 42-2. In other words, recesses 50 are formed where middle layer 42-2 is recessed relative to upper and lower layers 42-1 and 42-3, thereby forming a gap between upper layer 42-1 and lower layer 42-3. The open space between upper and lower layers 42-1 and 42-3 at the edges of interposer 36 creates a cavity for receiving one of strands 80 of fabric 12. As shown in FIG. 8, each strand 80 passes through a respective one of recesses 50.

In the example of FIG. 8, recesses 50 (sometimes referred to as grooves or cavities) extend parallel to one another along the y-axis of FIG. 8. This allows recesses 50 to receive strands 80 that also extend along the y-axis of FIG. 8. This is, however, merely illustrative. If desired, recesses 50 may extend parallel to the x-axis of FIG. 8 so that recesses 50 receive strands 80 that extend along the x-axis. Recesses 50 that extend parallel to the x-axis may be used in place of recesses 50 of FIG. 8 or may be used in conjunction with recesses 50 of FIG. 8. Interposer 36 may have two recesses 50 for receiving two strands 80, may have four recesses 50 for receiving four strands 80 (e.g., two warp strands and two weft strands), may have only one recess 50 for receiving one strand, may have six recesses 50 for receiving six strands, may have more than six recesses 50, less than six recesses 50, etc.). Arrangements where interposer 36 includes additional layers 42 may allow for additional recesses 50 in interposer 36. For example, interposer 36 may have two additional layers 42 between layer 42-3 and component 28-2. One of the additional layers may be recessed relative to the two adjacent layers, thereby forming additional recesses 50 for receiving strands 80.

Figure 9:
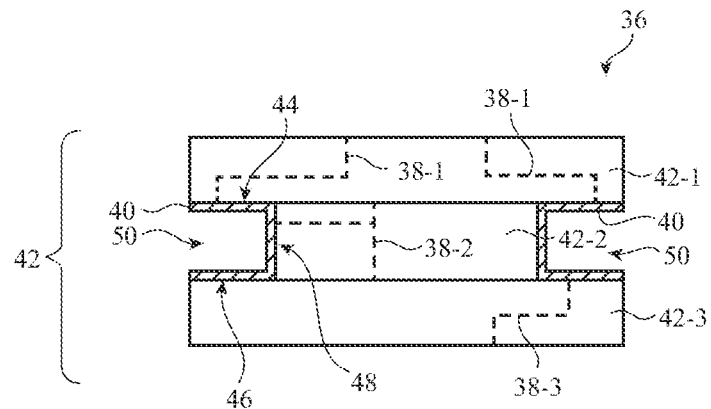
FIG. 9 is a side view of an illustrative interposer with recesses that are lined with conductive material in accordance with an embodiment.
Figure 10:
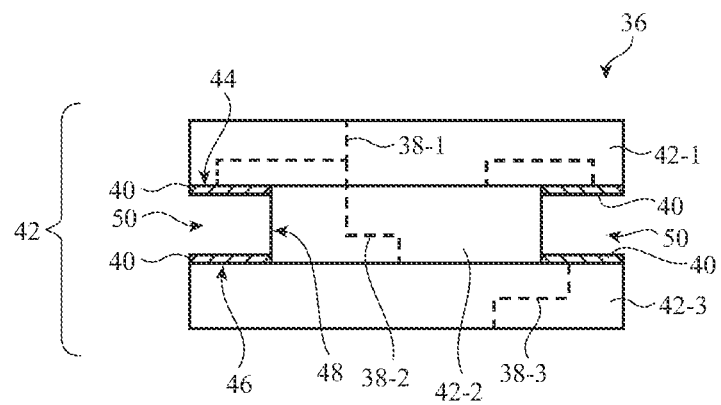
FIG. 10 is a side view of an illustrative interposer with recesses that are partially lined with conductive material in accordance with an embodiment.
Figure 11:
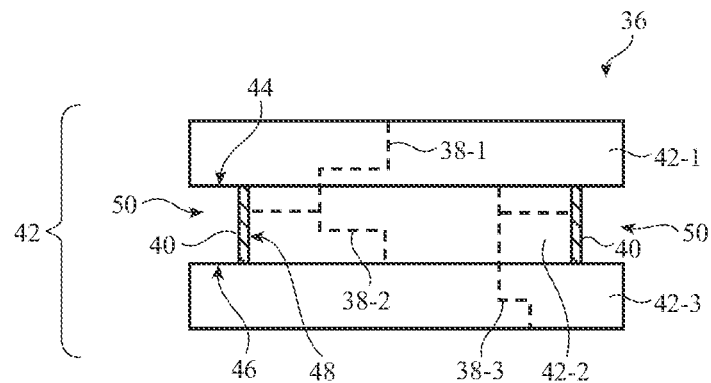
FIG. 11 is a side view of an illustrative interposer with recesses that are partially lined with conductive material in accordance with an embodiment.

Strands 80 may be electrically and mechanically coupled to conductive pads in recesses 50 of interposer 36. FIGS. 9, 10, and 11 show illustrative examples of conductive pads that may be formed in recesses 50.

In the example of FIG. 9, conductive pads 40 fully line the surfaces that form recesses 50. A portion of lower surface 44 of layer 42-1, a portion of upper surface 46 of layer 42-3 and edge surface 48 of layer 42-2 are covered with a conductive material to form pad 40. Conductive material (e.g., conductive material 82 of FIG. 7) may be used to electrically couple conductive portions of strands 80 to pads 40 of interposer 36.

In the example of FIG. 10, conductive pads 40 partially line the surfaces that form recesses 50. A portion of lower surface 44 of layer 42-1 and a portion of upper surface 46 of layer 42-3 are covered with a conductive material to form bond pads 40 in recesses 50.

In the example of FIG. 11, only the peripheral edge surface of middle layer 42-2 is covered with conductive material to form bond pads 40 in recesses 50.

Pads 40 may be formed by plating techniques or other suitable metal deposition techniques. In configurations where solder is used to electrically couple strands 80 to pads 40, inductive soldering techniques or other soldering techniques (e.g., techniques involving application of heat to solder using a hot bar or reflow oven), may be used to melt solder and thereby cause molten solder to penetrate into recess 50. Conductive strands 80 that are soldered to pads 40 in recesses 50 may be resistant to becoming dislodged due to the enhanced engagement between strands 80 and interposer 36.

Signals may be conveyed between electrical devices 28 and conductive strands 80 using metal traces 38. For example, layer 42-1 may include metal traces 38-1, layer 42-2 may include metal traces 38-2, and layer 42-3 may include metal traces 38-3 for conveying signals between the pads on interposer 36 coupled to device 28 (e.g., pads 34 of FIG. 5) and the pads on interposer 36 coupled to strand 80 (e.g., pads 40 of FIGS. 9, 10, and 11).

Figure 12:
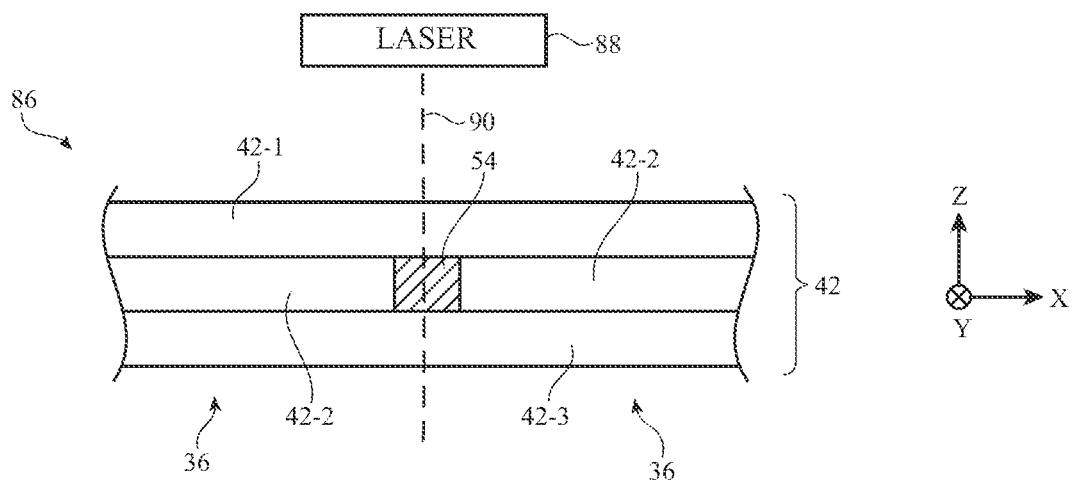
FIG. 12 is a side view of a panel of multiple interposers prior to being singulated into individual interposers in accordance with an embodiment.
Figure 13:
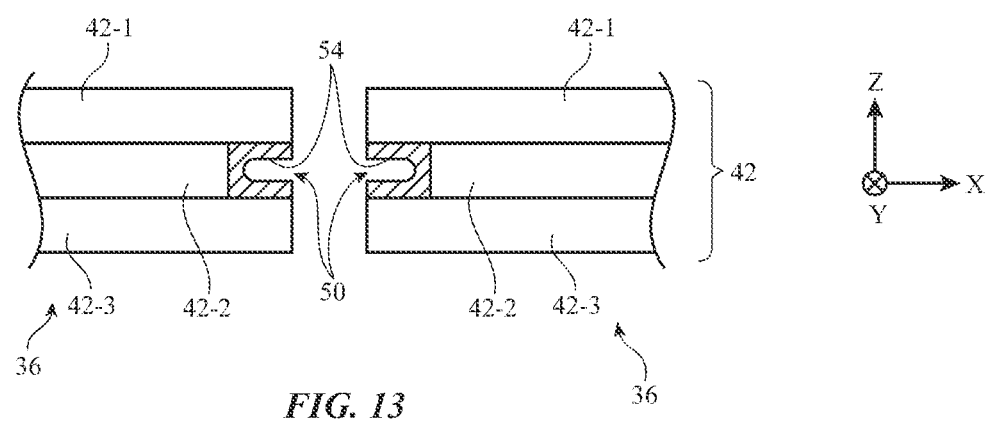
FIG. 13 is a side view of the interposers of FIG. 12 after being singulated into individual interposers in accordance with an embodiment.

FIGS. 12 and 13 show an illustrative method for forming recesses of the type shown in FIG. 8. As shown in FIG. 12, interposers 36 may be formed from a panel such as panel 86 that includes multiple interposers 36. At least some of layers 42 in panel 86 may be separated from one another using a solder bar such as solder bar 54. In the example of FIG. 12, layers 42-1 and 42-3 are continuous across the multiple interposers 36 in panel 86. Layer 42-2, on the other hand, is broken up into portions that are separated from one another by solder bar 54. Solder bar 54 may, for example, be a flux-core solder bar or other suitable solder material. Solder bar 54 may be electrically connected to conductive pads on each interposer 36 (e.g., conductive pads 40 of the type shown in FIGS. 9, 10, and 11).

A laser, saw, or other cutting tool may be used to singulate interposers 36. For example, a laser cutting tool such as laser 88 may be used to emit laser light in direction 90 to cut through panel 86 and thereby separate panel 86 into individual interposers 36, as shown in FIG. 13. The laser light emitted by laser 88 during the singulation process may heat and melt solder bar 54 so that cavities 50 are formed between upper layer 42-1 and lower layer 42-3 of each interposer 36. Strands 80 may be threaded through recesses 50 and solder 54 may be melted to lock strands in place in recesses 50 of interposers 36. If desired, additional conductive material or other structures may be formed on the outside of the conductive strand so that the conductive strand is fully enclosed within recess 50. If desired, other methods of forming recesses 50 may be used. The method of FIGS. 12 and 13 is merely illustrative.

Figure 14:
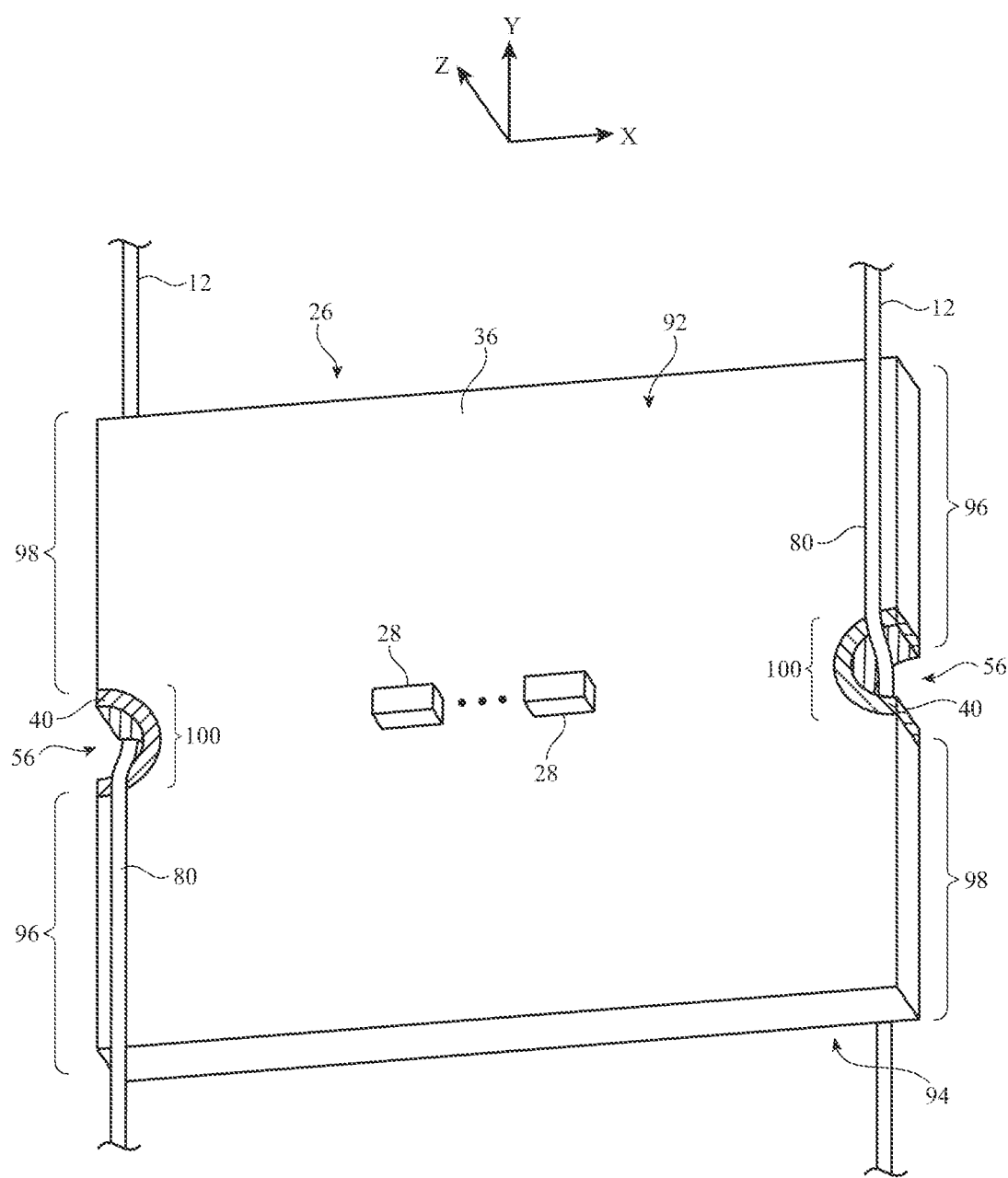
FIG. 14 is a perspective view of an illustrative interposer having notches for receiving conductive strands on first and second opposing sides of the interposer in accordance with an embodiment.

FIG. 14 illustrates another way of engaging interposer 36 with strands 80 of fabric 12. Interposer 36 of FIG. 14 may be a single layer interposer of the type shown in FIG. 7, may be a multi-layer interposer of the type shown in FIG. 8, or may have other suitable construction. As shown in FIG. 14, interposer 36 has notches such as notches 56 on opposing sides of interposer 36. Notches 56 extend from upper surface 92 of interposer 36 to lower surface 94 of interposer 36 (e.g., parallel to the z-axis of FIG. 14).

Notches 56 (sometimes referred to as recesses, openings, cavities, slots, holes, or castellations) may each be configured to receive an associated one of strands 80 of fabric 12. As shown in FIG. 14, each strand 80 may have a first portion such as portion 96 that passes over top surface 92 of interposer 36, a second portion such as portion 98 that passes over lower surface 94 of interposer 36, and a third portion such as portion 100 that passes through notch 56 (e.g., from upper surface 92 to lower surface 94 or vice versa). In other words, strands 80 may be "threaded" through notches 56 to enhance the mechanical engagement between strands 80 and interposer 36.

Notches 56 may be lined or partially lined with conductive material 40 that forms bond pads in notches 56. Solder or other conductive material may be used to electrically and mechanically couple strands 80 to conductive pads 40 in notches 56 of interposer 36. Pads 40 may be formed by plating techniques or other suitable metal deposition techniques. In configurations where solder is used to electrically couple strands 80 to pads 40, inductive soldering techniques or other soldering techniques (e.g., techniques involving application of heat to solder using a hot bar or reflow oven), may be used to melt solder and thereby cause molten solder to penetrate into notch 56. Conductive strands 80 that are soldered to pads 40 in notches 56 may be resistant to becoming dislodged due to the enhanced engagement between strands 80 and interposer 36.

The example of FIG. 14 in which notches 56 are formed on first and second opposing sides of interposer 36 is merely illustrative. If desired, notches 56 may be formed on one side, two sides, three sides, or all four sides of interposer 36. In configurations where interposer 36 has multiple layers (e.g., layers 42 of FIG. 8), each notch 56 may extend through all of the layers or may extend through less than all of the layers.

Figure 15:
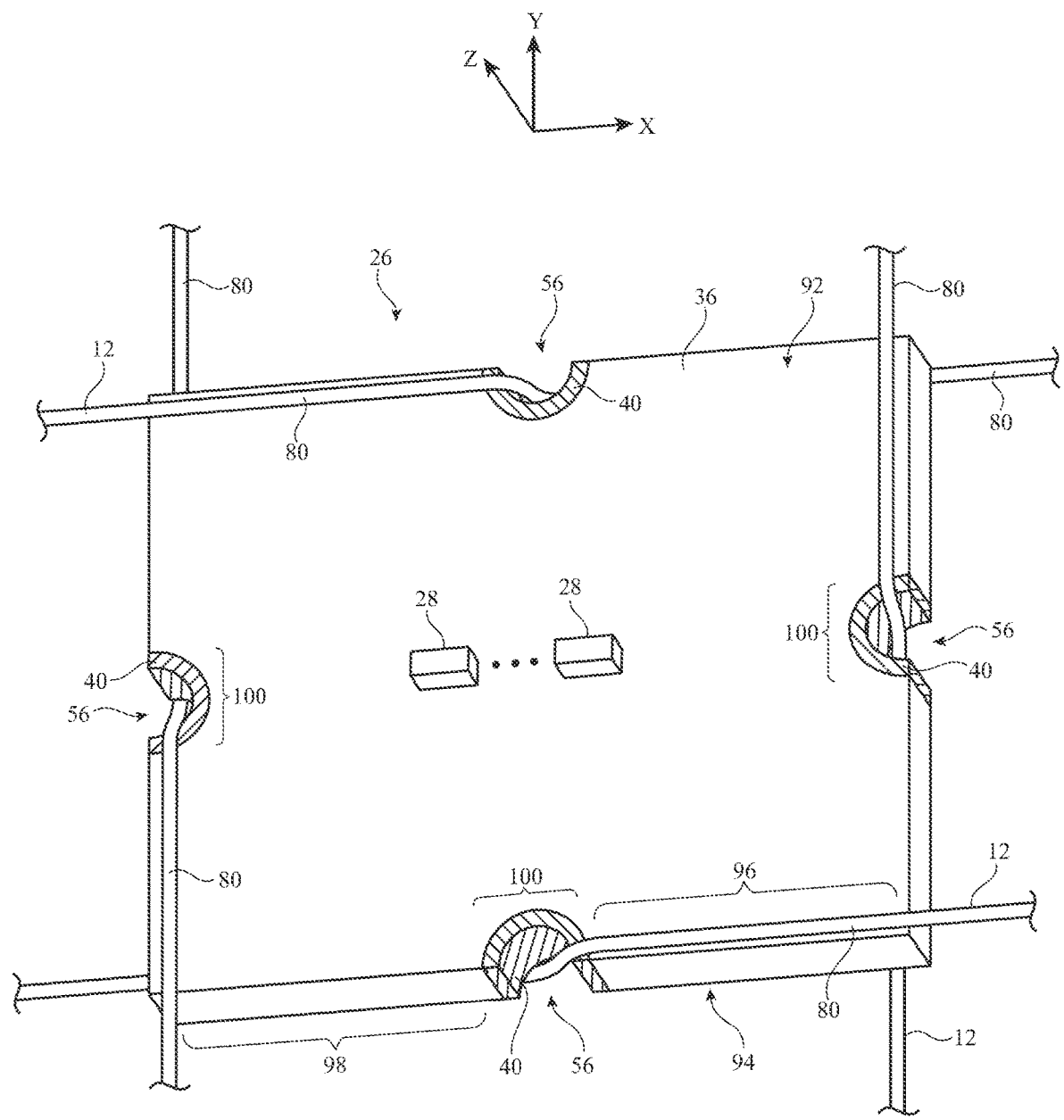
FIG. 15 is a perspective view of an illustrative interposer having notches for receiving conductive strands on four sides of the interposer in accordance with an embodiment.

FIG. 15 shows an example in which notches 56 have been formed on all four sides of interposer 36. As in the example of FIG. 14, each strand 80 may have a first portion such as portion 96 that passes over top surface 92 of interposer 36, a second portion such as portion 98 that passes over lower surface 94 of interposer 36, and a third portion such as portion 100 that passes through notch 56 (e.g., from upper surface 92 to lower surface 94 or vice versa). In other words, strands 80 may be "threaded" through notches 56 to enhance the mechanical engagement between strands 80 and interposer 36. The arrangement of FIG. 15 allows both warp strands and weft strands to be threaded through interposer 36. For example, strands 80 extending parallel to the x-axis of FIG. 15 may be weft strands and strands 80 extending parallel to the y-axis of FIG. 15 may be warp strands, or vice versa.

Figure 16:
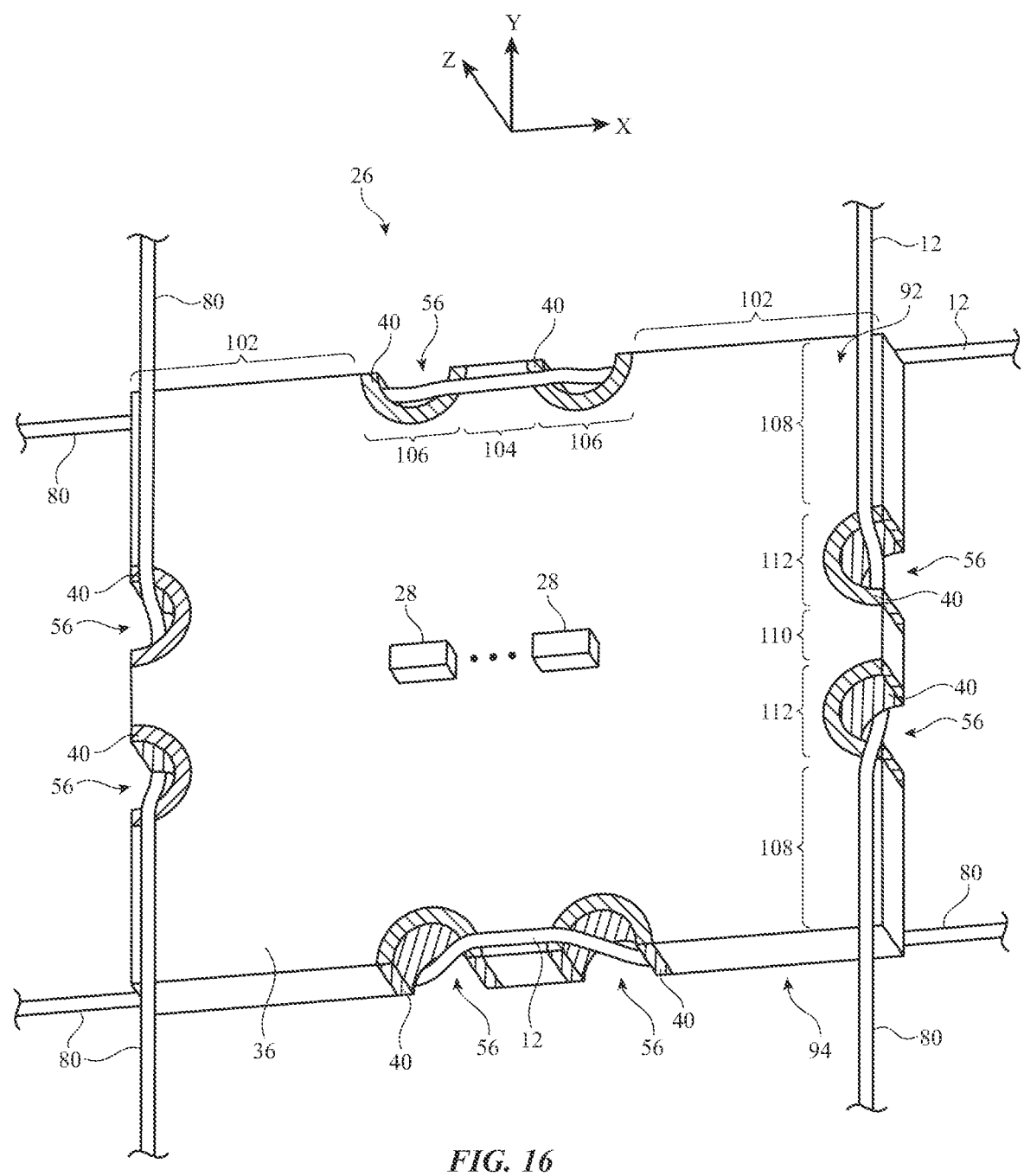
FIG. 16 is a perspective view of an illustrative interposer having multiple notches in each side of the interposer in accordance with an embodiment.

FIG. 16 shows an example in which multiple notches 56 have been formed on each of the four sides of interposer 36. In this example, each strand 80 extending parallel to the x-axis of FIG. 16 has two portions 102 that pass over lower surface 94 of interposer 36, two portions 106 that pass through notches 56, and middle portion 104 that passes over upper surface 92 of interposer 36 (between notches 56). Each strand 80 extending parallel to the y-axis of FIG. 16 has two portions 108 that pass over upper surface 92 of interposer 36, two portions 112 that pass through notches 56, and middle portion 110 that passes over lower surface 94 of interposer 36 (between notches 56).

Figure 17:
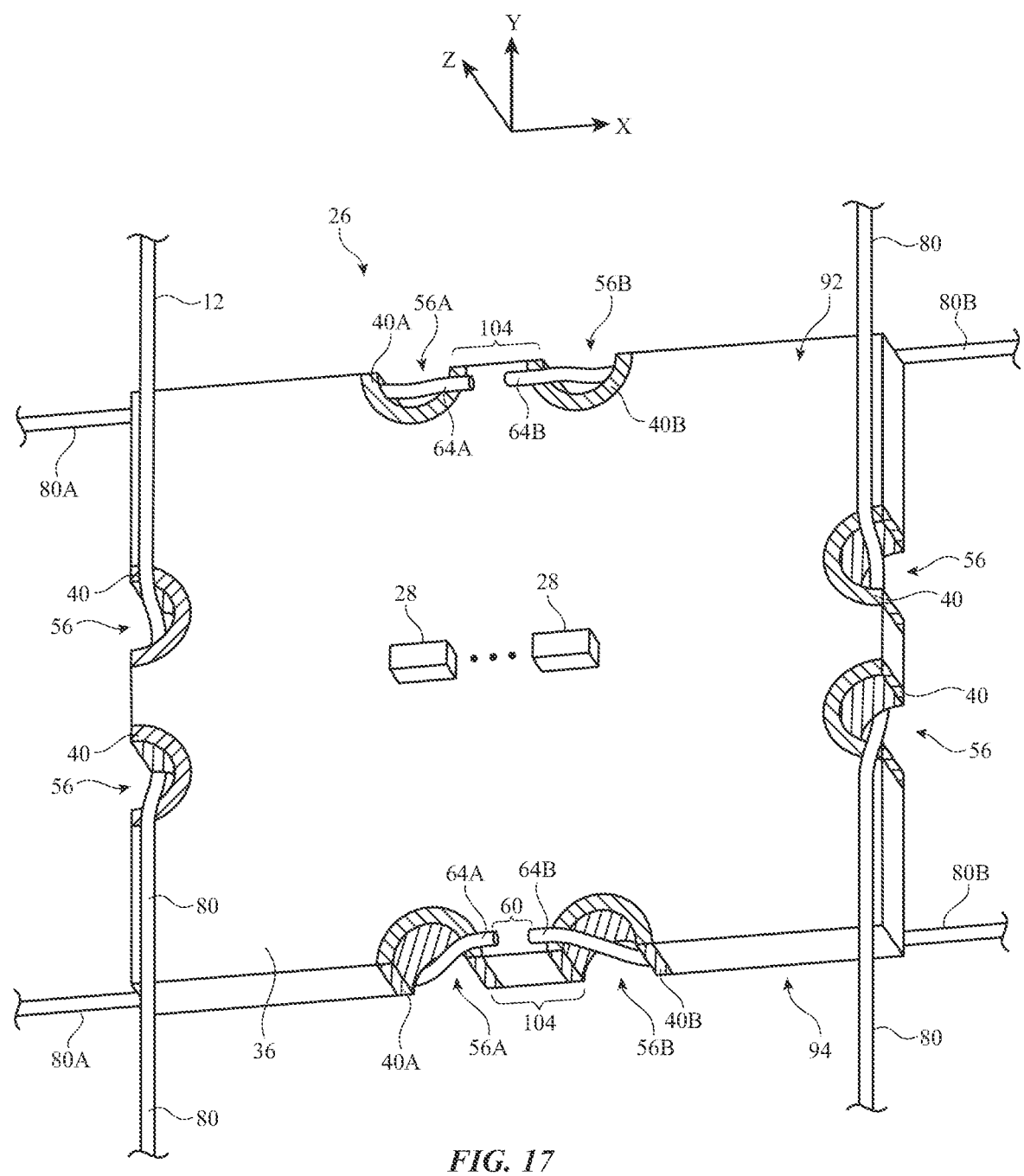
FIG. 17 is a perspective view an illustrative interposer having notches for receiving conductive strands that are cut to form two separate signal paths in accordance with an embodiment.

FIG. 17 shows an example in which one or more of strands 80 have been cut to form first and second distinct signal paths from the same strand. Interposer 36 may have the same configuration as interposer 36 of FIG. 16 or may have any other suitable configuration. Components on interposer 36 such as components 28 may have multiple terminals (e.g., two or more terminals, three or more terminals, four or more terminals, or other suitable number of terminals). It may be desirable to couple these terminals to a single strand while still using separate signal paths for each terminal. As shown in FIG. 17, portion 104 of strand 80 may be cut to form a gap 60 that separates strand 80 into first strand segment 80A and second strand segment 80B. Strand segment 80A has a first end such as end 64A coupled to conductive pad 40A in notch 56A and strand segment 80B has a second end such as end 64B coupled to conductive pad 40B in notch 56B. A component mounted to interposer 36 may have a first terminal coupled to pad 40A and a second terminal coupled to pad 40B. The first terminal of the component may be electrically coupled to strand segment 80A, whereas the second terminal of the component may be electrically coupled to strand segment 80B.

The example of FIG. 17 in which both of the strands 80 extending parallel to the x-axis of FIG. 17 are cut to form two separate signal paths is merely illustrative. If desired, only one of these two strands may be cut and the other may form a continuous path. If desired, one or more of strands 80 that extend parallel to the y-axis of FIG. 17 may be cut to form two strand segments and separate signal paths.

Figure 18:
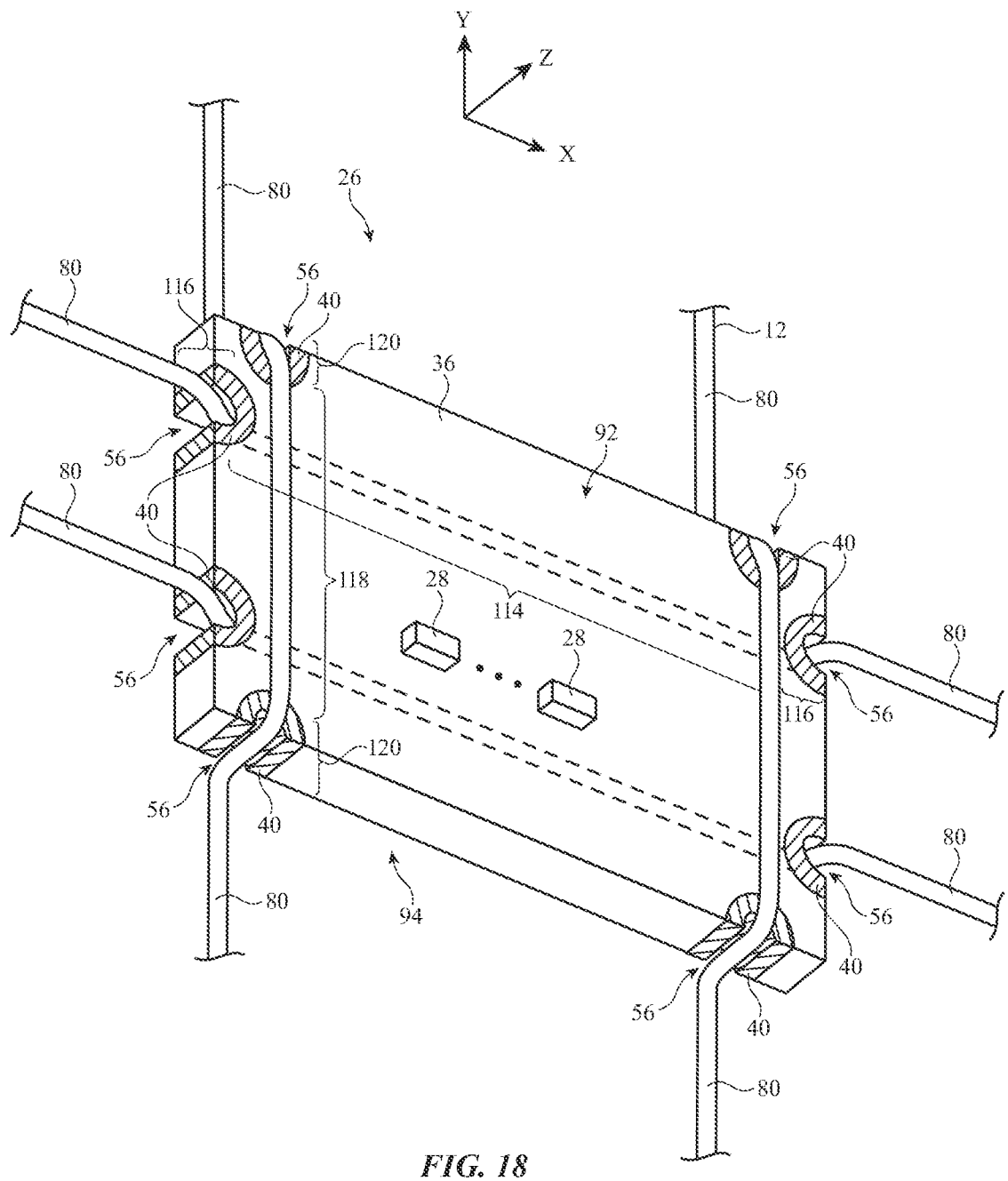
FIG. 18 is a perspective view of an illustrative interposer having notches at the corners of the interposer in accordance with an embodiment.

FIG. 18 shows an example in which notches 56 are formed on opposing sides of each corner of interposer 36. Strands 80 that extend parallel to the x-axis of FIG. 18 may have a portion such as portion 114 that extends over lower surface 94 of interposer 36. On either side of portion 114, strand 80 has portions 116 that extend through notches 56 on opposing sides of interposer 36. Strands 80 that extend parallel to the y-axis of FIG. 18 may have a portion such as portion 118 that extends over upper surface 92 of interposer 36. On either side of portion 118, strand 80 has portions 120 that extend through notches 56 on opposing sides of interposer 36. If desired, one or more of strands 80 may be cut (e.g., as in the example of FIG. 17) to form separate signal paths from a single strand 80.

If desired, strands 80 may be mechanically coupled to interposer 36 in additional locations (e.g., locations other than notches 56). For example, adhesive, solder, or other suitable attachment members may be used to attach strands 80 to upper surface 92 and/or lower surface 94 of interposer 36 (e.g., as in the example of FIG. 7). Using notch connections in conjunction with upper/lower surface connections may help securely attach interposer 36 to fabric 12. In this type of arrangement, some of the connections may be purely mechanical and need not be electrical. For example, upper/lower surface connections of the type shown in FIG. 7 may be purely mechanical connections and notch connections of the type shown in FIGS. 14-18 may be electrical and mechanical connections, or vice versa.

If desired, recesses of the type shown in FIG. 8 and notches of the type shown in FIGS. 14-18 may be modified to fully surround conductive strand 70. For example, rather than a recess or notch that exposes strand 80 on one side, recesses 50 and notches 56 may be holes in interposer 36 that are completely surrounded by portions of interposer 36. In other words, rather than removing an outermost edge portion of interposer 36 to form notch 56, a fully enclosed hole may be formed in interposer 36 slightly offset from the edge of interposer 36. Holes of this type in interposer 36 may ensure that component 26 remains on fabric 12 even if a solder connection between interposer 36 and strand 80 fails.

In the examples of FIGS. 7, 8, 14, 15, 16, 17, and 18, interposer 36 is mounted to fabric 12 such that some strands 80 of fabric 12 extend parallel to the sides of interposer 36 and some strands 80 of fabric 12 extend perpendicular to the sides of interposer 36. This is merely illustrative. If desired, interposer 36 may be mounted to fabric 12 such that the sides of interposer 36 are angled relative to strands 80 of fabric 12 (e.g., oriented at an angle between 0° and 90°). This type of arrangement is illustrated in FIGS. 19 and 20.

Figure 19:
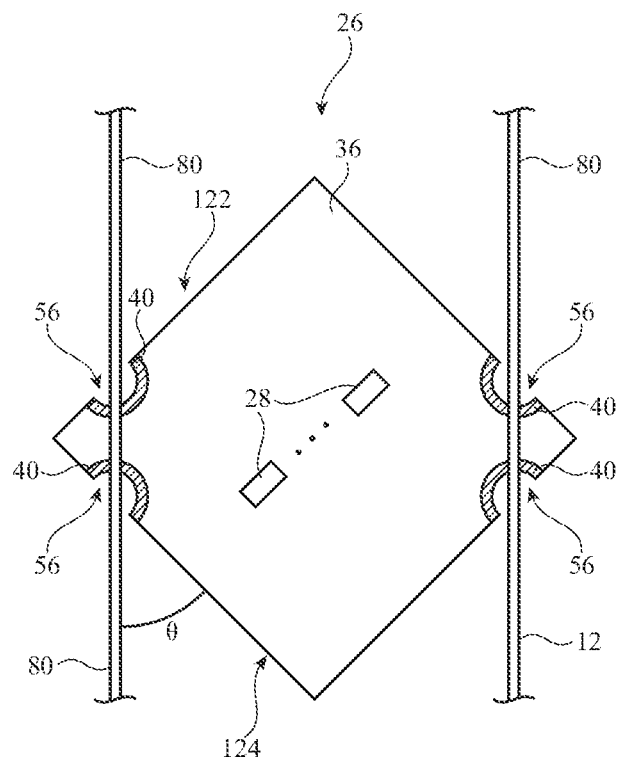
FIG. 19 is a top view of an illustrative interposer that is rotated relative to conductive strands in accordance with an embodiment.
Figure 20:
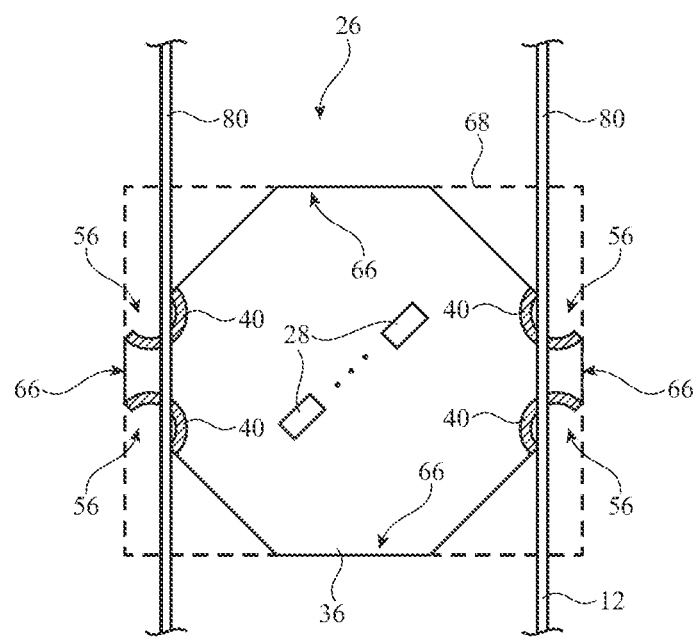
FIG. 20 is a top view of an illustrative interposer that is rotated relative to conductive strands and that is trimmed to fit in a pocket in accordance with an embodiment.

As shown in FIG. 19, interposer 36 may be mounted to strands 80 such that the sides of interposer 36 are angled relative to strands 80. The angle Θ between side 124 and strand 80 may, for example, be between 0° and 90°, 0° and 45°, 45° and 90°, 30° and 60°, about 45°, or other suitable angle.

Notches 56 may be located on opposing sides of one or more corners of interposer 36 such that each strand 80 extends through a notch 56 on one side of interposer 36 (e.g., side 122) and through a notch 56 on an adjacent side of interposer 36 (e.g., side 124). The example of FIG. 19 in which strands 80 extend over the same side of interposer 36 is merely illustrative. If desired, one strand 80 may extend over the top of interposer 36 and another strand 80 may extend under the bottom of interposer 36. Notches 56 may be formed on either side of one corner, on either side of two corners, on either side of three corners, or on either side of all four corners of interposer 36.

In some arrangements, component 26 may be embedded in fabric 12 by inserting component 26 into a pocket formed in fabric 12. For example, during the process of weaving or otherwise forming fabric 12, a pocket may be formed in fabric 12 that helps fabric 12 receive electrical components 26 and that helps align the conductive pads of component 26 with the conductive structures in fabric 12. Pockets in fabric 12 may be formed by omitting layers of fabric from internal portions of fabric layer 12, thereby forming a pocket having a shape and size appropriate to receive component 26.

It may be desirable to alter the shape of interposer 36 to fit the shape and size of the pocket in fabric 12. As shown in FIG. 20, for example, fabric 12 may have a pocket such as rectangular pocket 68. Pocket 68 may be formed during weaving operations (or other fabric assembly operations) and component 26 may be mounted in pocket 68 during weaving operations (or other fabric assembly operations). Pocket 68 may be formed by changing the architecture of the fabric using two or more layers of fabric.

In the example of FIG. 20, pocket 68 forms a rectangular recess in fabric 20 for receiving component 26. In order to fit the shape of pocket 68, the corners of interposer 36 may be trimmed (e.g., squared off) such that the edges of interposer 36 do not extend beyond the walls of pocket 68 in fabric 12. The example of FIG. 20 where all four corners have been trimmed and to fit within pocket 68 is merely illustrative. If desired, fewer than all four corners of interposer 36 may be trimmed to provide interposer 36 with a desired shape based on the corresponding shape of pocket 68 in fabric 12. Arrangements where one or more sides of interposers 36 is trimmed to fit within pocket 68 may also be used.

Figure 21:
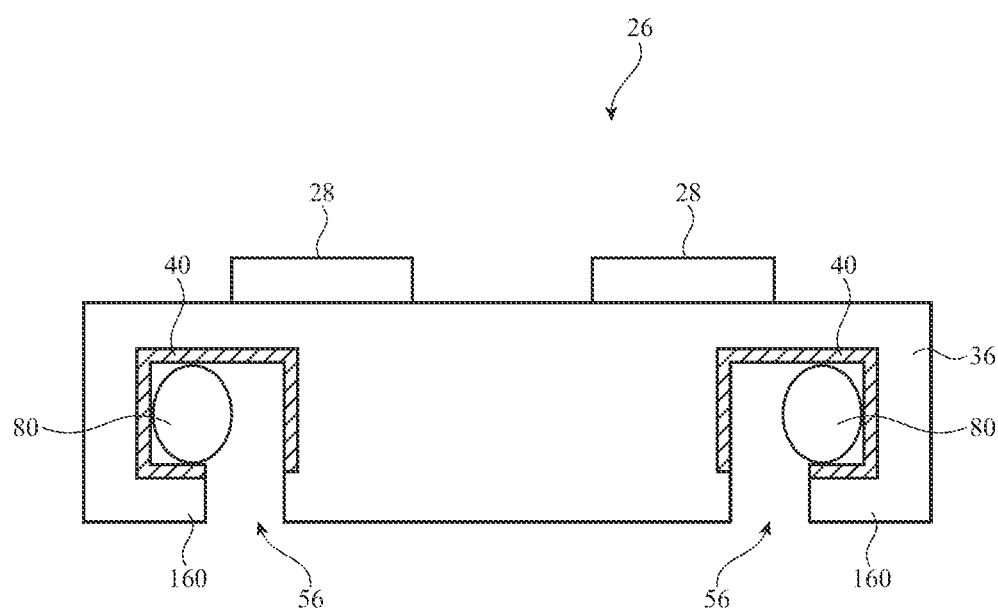
FIG. 21 is a side view of an illustrative interposer having recesses in a lower surface that are partially enclosed to contain strands in the recesses in accordance with an embodiment.

FIG. 21 shows an example in which notches 56 have been formed in a lower surface of interposer 36. Each strand 80 may pass through an associated one of notches 56. In other words, strands 80 may be "threaded" through notches 56 to enhance the mechanical engagement between strands 80 and interposer 36. If desired, a portion of interposer 36 such as portion 130 may extend behind strand 80 such that strand 80 is partially enclosed by interposer 36 within notch 56 (e.g., such that interposer 36 completely or partially surrounds the diameter of strand 80). Notches 56 may be lined or partially lined with conductive material 40 that forms bond pads in notches 56. Solder or other conductive material may be used to electrically and/or mechanically couple strands 80 to conductive pads 40 in notches 56 of interposer 36.

Figure 22:
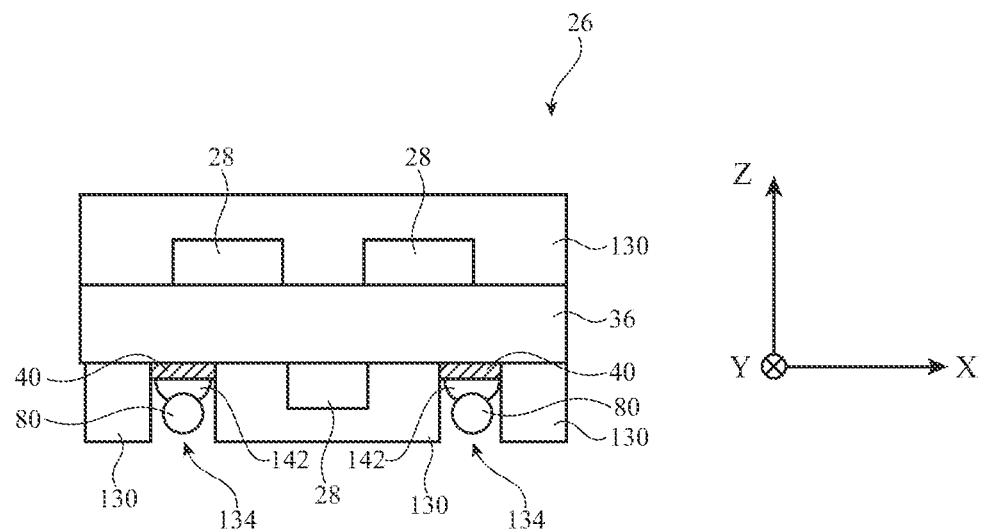
FIG. 22 is a side view of an illustrative component having a protective cover with trenches through which fabric strands are threaded in accordance with an embodiment.

FIGS. 22-43 illustrate examples in which strands 80 are threaded through portions of protective structure 130 (e.g., in components of the type shown in FIG. 6). In the example of FIG. 22, protective structure 130 is formed on opposing sides of interposer 36. Protective structure 130 may include trenches such as trenches 134 (sometimes referred to as recesses, openings, notches, grooves, etc.). Trenches 134 may be formed by removing portions of protective structure 130 (e.g., using a laser, a mechanical saw, a mechanical mill, or other equipment) or may be formed by molding (e.g., injection molding) or otherwise forming protective structure 130 into a shape that includes trenches 134. Trenches may have a width between 2 mm and 6 mm, between 1 mm and 5 mm, between 3 mm and 8 mm, greater than 3 mm, less than 3 mm, or other suitable width. If desired, trenches 134 may have different depths (e.g., to expose contact pads 40 that are located at different z-heights of interposer 36).

Trenches 134 may expose conductive pads 40 on interposer 36. Strands 80 may each be threaded through an associated one of trenches 134 in protective structure 130. Solder or other conductive material 142 may be used to electrically and mechanically couple strands 80 to conductive pads 40 in notches 134 of protective cover 130. Because strands 80 are wedged between portions of protective cover 130, strands 80 may be resistant to becoming dislodged from interposer 36. In addition to holding strands 80 in place so that component 26 remains attached to fabric 12, trenches 134 may also be used as a physical guide for aligning component 26 relative to fabric 12 during the attachment process. This may be beneficial when aligning and attaching component 26 to fabric 12 without line of sight.

Figure 23:
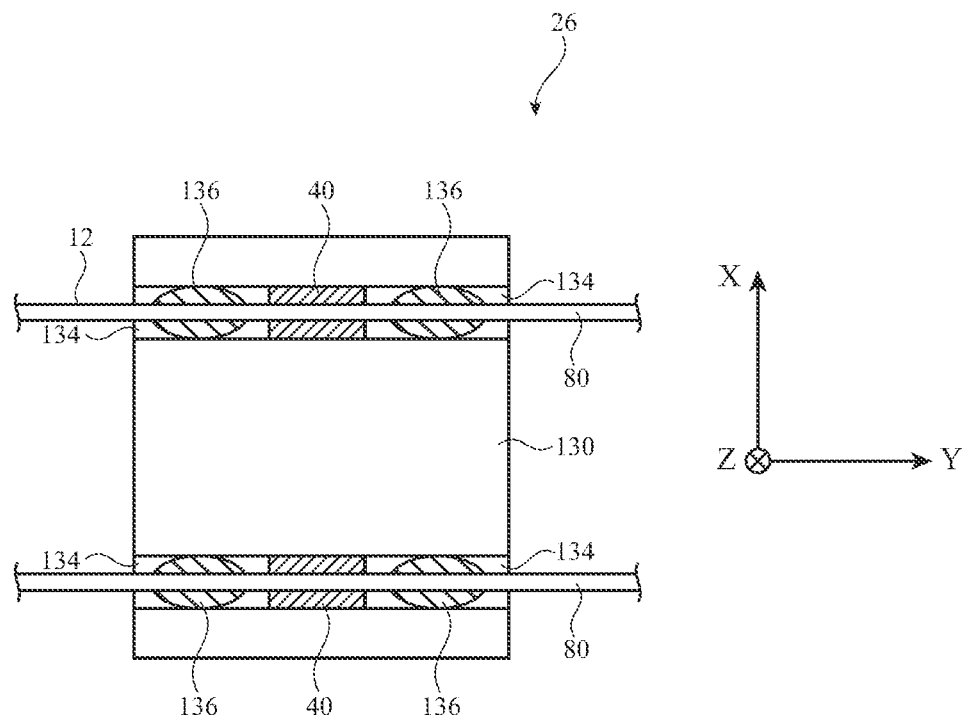
FIG. 23 is a bottom view of an illustrative component having a protective cover with trenches through which fabric strands are threaded in accordance with an embodiment.

FIG. 23 is a bottom view of component 26 (e.g., component 26 of FIG. 22) showing how adhesive may, if desired, be used to enhance the mechanical robustness of the connection between component 26 and strands 80. As shown in FIG. 23, adhesive 136 (e.g., a hot-melt adhesive, epoxy, a thermoplastic material such as ethylene-vinyl acetate, acrylic, polyethylene, other thermoplastic material, or other suitable adhesive) may attach portions of strands 80 in trenches 134 to interposer 36. If desired, adhesive 136 may be used to attach non-conductive portions of strands 80 to interposer 36, whereas conductive portions of strands 80 may be attached to pads 40 using solder 142 (FIG. 22). This is, however, merely illustrative. If desired both solder and adhesive may be used to attach a given portion of strands 80 to interposer 36. Solder may provide electrical coupling while a hot-melt adhesive or other material (e.g., an encapsulant) may form a seal around the electrical connection to protect the connection from mechanical damage as well as moisture and other environmental contaminants. If desired, a solder mask may be used in regions of trenches 134 without pads 40 to help prevent solder 142 from reaching those areas.

Figure 24:
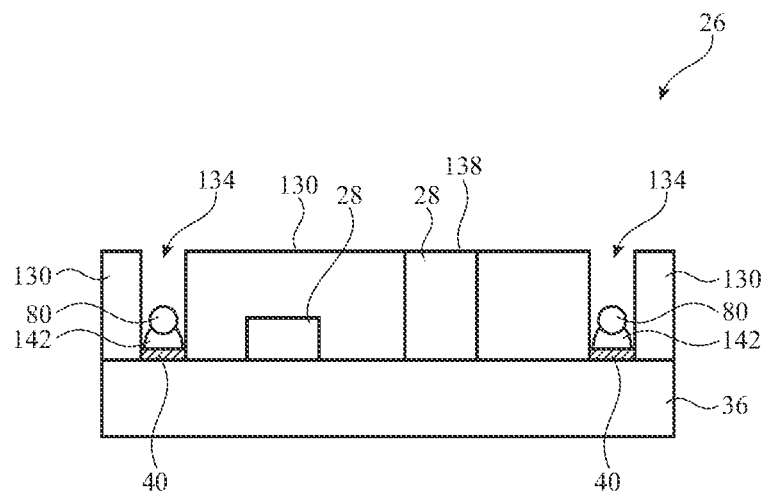
FIG. 24 is a side view of an illustrative component having a protective cover with trenches through which fabric strands are threaded and openings for exposing electrical devices on an interposer in accordance with an embodiment.

FIG. 24 shows an example in which devices 28, protective cover 130, and strands 80 are all formed on one side of interposer 36. If desired, protective cover 130 may selectively expose one or more electrical devices 28 on interposer 36. In the example of FIG. 24, top surface 138 of device 28 is exposed through an opening in protective cover 130. This may allow an external electrical path (e.g., a flex circuit, a conductive strand, etc.) to couple to device 28 and/or may allow device 28 to send or receive information without requiring that information to pass through protective cover 130. For example, if device 28 is a sensor that should be left exposed (e.g., to detect light, sound, moisture, temperature, etc.), then protective cover 130 may be shaped so that device 28 is exposed.

Figure 25:
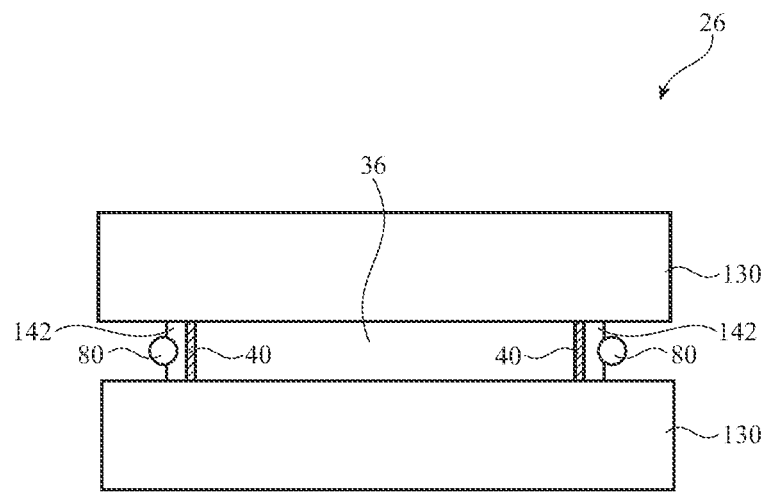
FIG. 25 is a side view of an illustrative component having upper and lower protective covers that protrude beyond the edges of an interposer to form a trench through which fabric stands are threaded in accordance with an embodiment.

FIG. 25 shows an example in which strands 80 are threaded through trenches 134 that are formed along either side of interposer 36. The upper and lower protective covers 130 protrude beyond the outer edges of interposer 36, thereby forming trenches 134. Protective cover 130 on one side of interposer 36 forms a first sidewall of each trench 134, and protective cover 130 on an opposing side of interposer 36 forms a second sidewall of each trench. Solder or other conductive material 142 may be used to electrically and mechanically couple strands 80 to pads 40 in trenches 134.

It may be desirable to further increase the mechanical robustness of the connection between strands 80 and component 26 by embedding strands 80 within a material in trenches 134. For example, strands 80 may be embedded within solder, polymer, epoxy, other material, or a combination of materials that help to enclose strands 80 within trenches 134.

Figure 26:
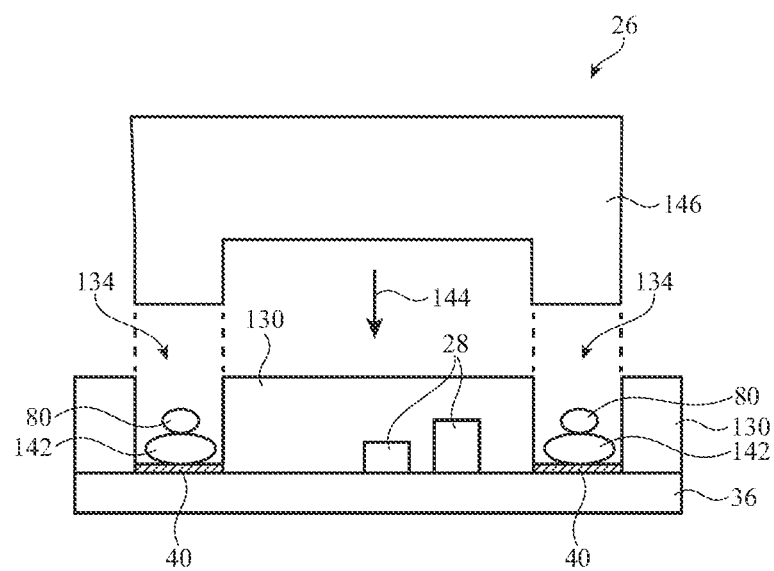
FIGS. 26, 27, and 28 show illustrative steps involved in attaching a component to fabric strands using trenches in a protective cover and a thermoplastic structure that guides the fabric strands into the trenches in accordance with an embodiment.
Figure 27:
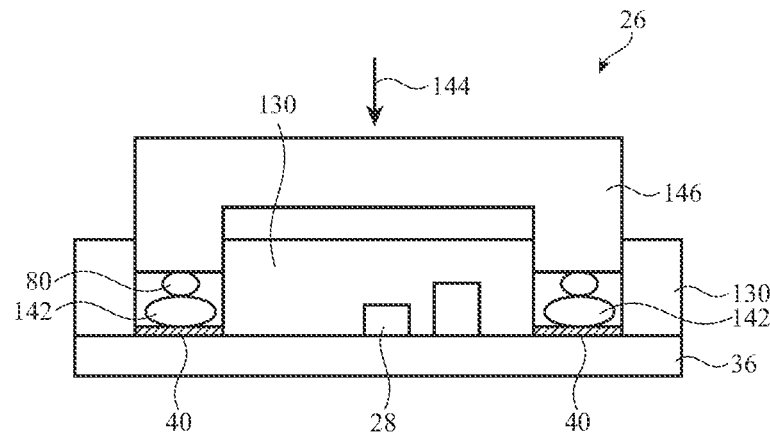
Figure 28:
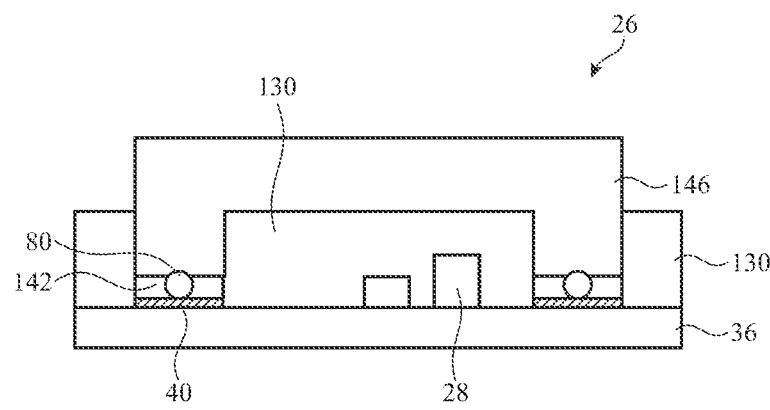

FIGS. 26-28 show an illustrative process for enclosing strands 80 within trenches 134 using thermoplastic material and solder.

In the step shown in FIG. 26, solder 142 (e.g., solder paste, pre-apply solder, or preform solder) is formed in trenches 134 over pads 40. Strands 80 are then inserted into trenches 134 over solder 142.

In the step shown in FIG. 27, a thermoplastic structure such as thermoplastic structure 146 having protruding portions that match the shape of trenches 134 is press-fit onto protective cover 130 so that the protruding portions of thermoplastic structure 146 extend into trenches 134 of protective cover 130. This causes thermoplastic structure 146 to press strands 80 against solder 142 and pads 40 in trenches 134, thereby ensuring electrical contact between pads 40 and strands 80. Thermoplastic structure 146 may be formed from a thermoplastic material such as ethylene-vinyl acetate, acrylic, polyethylene, or other suitable thermoplastic material.

In the step shown in FIG. 28, heat may be applied to melt thermoplastic structure 146 and reflow solder 142, thereby forming a solder joint between strand 80 and pad 40 while also sealing the solder joint with thermoplastic material 146. Heat may be applying using induction heating, hot air, resistive heating, or other heating techniques. In some scenarios, heating of solder 142 may cause strands 80 to penetrate down into the molten solder 142 such that solder 142 fully surrounds the diameter of strand 80. Once cool, thermoplastic 146 and solder 142 may harden, leaving strands 80 securely embedded within solder 142 and thermoplastic 146. Thermoplastic 146 may protect the solder joint from mechanical damage and environmental contaminants.

FIGS. 29-33 show another illustrative process for enclosing strands 80 in trenches 134 using solder and thermoplastic material.

Figure 29:
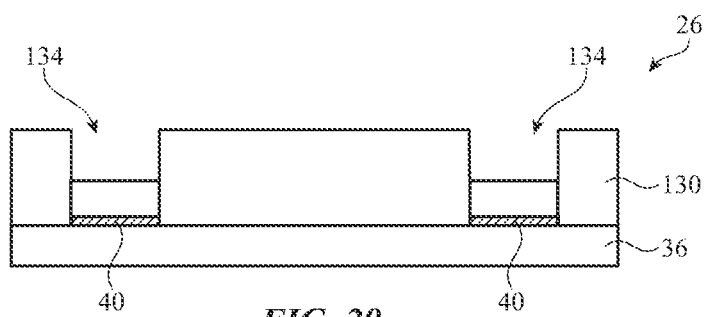
FIGS. 29, 30, 31, 32, and 33 show illustrative steps involved in attaching a component to fabric strands by threading the fabric strands through trenches in a protective cover and heating solder and thermoplastic material to draw the fabric strands down into the solder and under the thermoplastic material in accordance with an embodiment.

In the step shown in FIG. 29, trenches 134 may be formed in protective cover 130 to expose contact pads 40 on interposer 36. Solder 142 (e.g., solder paste, pre-apply solder, or preform solder) may be placed in trenches 134 over pads 40.

Figure 30:
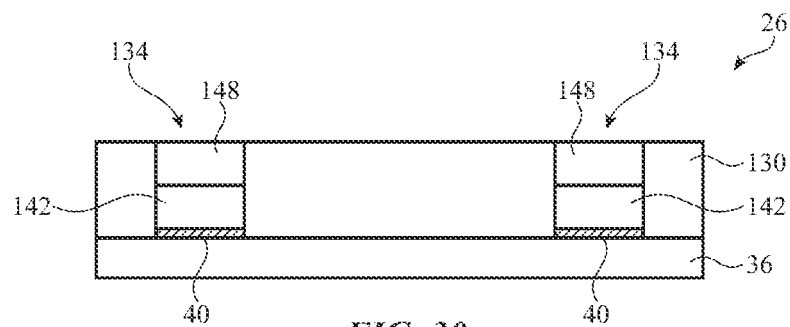

In the step shown in FIG. 30, thermoplastic material 148 may be deposited in trenches 134 over solder 142. Materials that may be used to form thermoplastic material 148 include ethylene-vinyl acetate, acrylic, polyethylene, or other suitable thermoplastic material.

Figure 31:
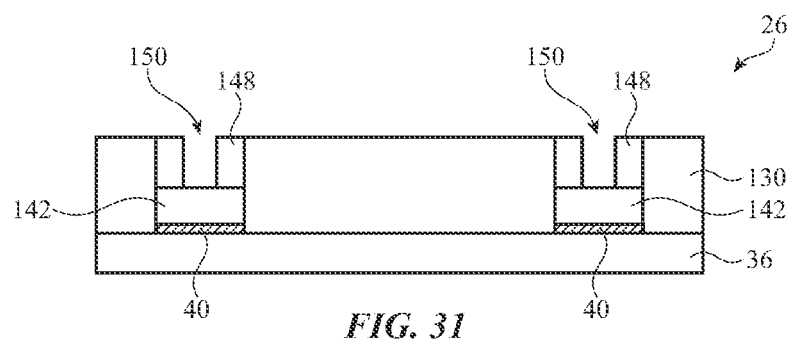

In the step shown in FIG. 31, trenches 150 may be formed in thermoplastic material 148. Trenches 150 may be formed using laser equipment, machining equipment, or other suitable equipment. This is, however, merely illustrative. If desired, thermoplastic material 148 may be deposited in trenches 134 around a structure that is then removed, thereby leaving openings 150 in thermoplastic material 148. Trenches may also be formed in solder 142, if desired. The example of FIG. 31 is merely illustrative.

Figure 32:
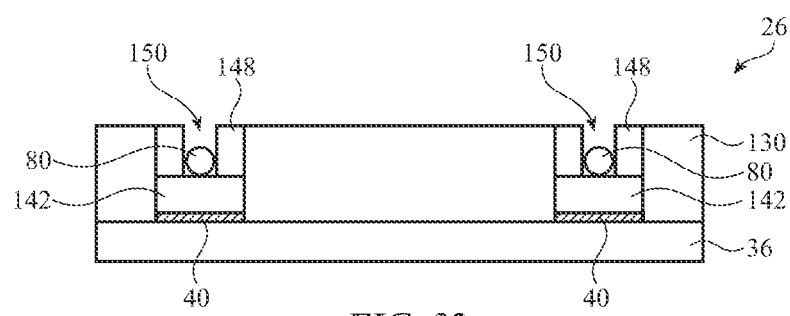

In the step shown in FIG. 32, strands 80 may be placed within trenches 150 (which in turn are located in trenches 134).

Figure 33:
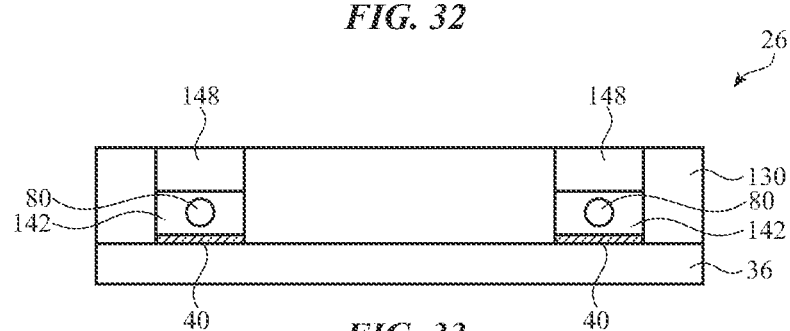

In the step shown in FIG. 33, heat may be applied to melt thermoplastic material 148 and reflow solder 142. Heat may be applying using induction heating, hot air, resistive heating, or other heating techniques. When solder 142 becomes molten, strands 80 may sink down into solder 142, as shown in FIG. 33. When thermoplastic 148 melts, it spreads across trench 134 (thereby closing opening 150 that was made in thermoplastic 148 in the step of FIG. 31). After thermoplastic 148 and solder 142 have cooled, strands 80 will be firmly embedded in solder 142, and hardened thermoplastic material 148 may form a seal over the electrical connection between strand 80 and pad 40.

The order of steps described in connection with FIGS. 29-33 are merely illustrative. For example, solder 142 may be reflowed to form a solder joint between strands 80 and pads 40 before thermoplastic material 148 is deposited in trenches 134 and melted to seal the solder joint. If desired, customized heating techniques may be used depending on which material is being targeted (e.g., a first heating method may be used to reflow solder and a second heating method may be used to subsequently melt thermoplastic material 148).

Figure 34:
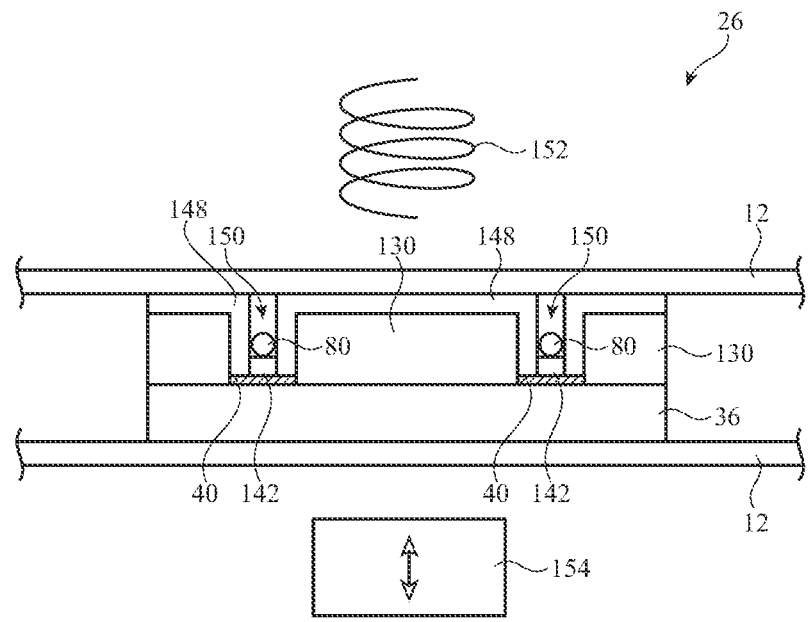
FIG. 34 is a side view of illustrative equipment including inductive heating equipment and a transducer which may be used to attach a component to fabric in accordance with an embodiment.

FIG. 34 shows how a transducer may be used during the attachment process (e.g., an attachment process of the type shown in FIGS. 26-28 or of the type shown in FIGS. 29-33) to help guide strands into trenches on component 26. As shown in FIG. 34, component 26 may be placed between portions of fabric 12. Without line-of-sight capability during the attachment process, it may be challenging to guide strands 80 of fabric 12 into trenches 134 and attach strands 80 to pads 40 on interposer 36. To help guide strands 80 into trenches 134, a transducer such as transducer 154 may be used to help press fabric 12 against component 26 during the attachment process. The force applied on fabric 12 from transducer 154 causes strands 80 to fall into trenches 134.

If desired, transducer 154 may be used during the heating process (e.g., when solder 142 is being reflowed and/or when thermoplastic 148 is being melted in trenches 134). In the example of FIG. 34, induction coil 152 is used to inductively heat conductive structures in component 26. For example, induction coil 152 may be used to inductively heat solder 142, conductive portions of strand 80, and/or other metal elements in component 26. The heating of conductive elements in component 26 may in turn cause thermoplastic 148 to melt and spread across trenches 134 (e.g., as described in connection with FIGS. 28 and 33). When transducer 154 is used during the heating process, strands 80 may be guided into trenches 134 and may sink down into molten solder 142. After solder 142 and thermoplastic 148 have cooled and hardened, strands 80 may be mechanically and electrically coupled to pads 40 via solder 142, with thermoplastic 148 providing a seal that protects the connection from mechanical damage and environmental contaminants.

Figure 35:
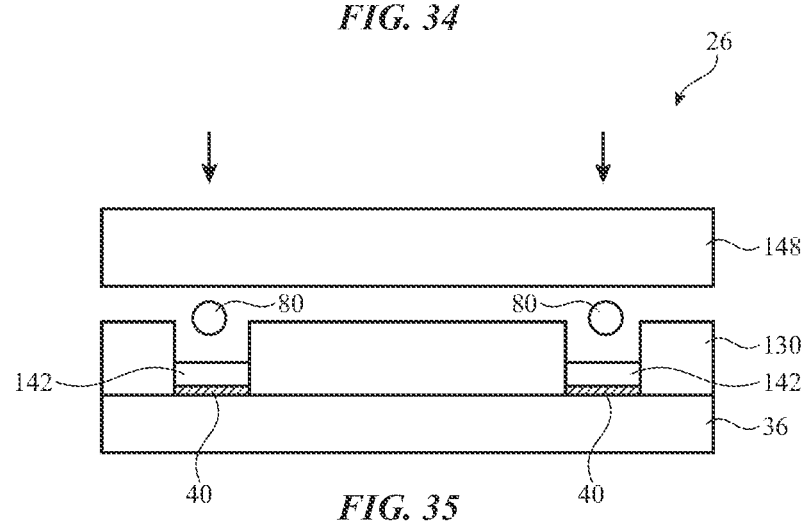
FIG. 35 is a side view of an illustrative component in which a thermoplastic structure presses fabric strands into trenches and is subsequently heated to seal the fabric strands in the trenches in accordance with an embodiment.

FIG. 35 shows an example in which a layer of thermoplastic 148 is used to press down on strands 80 to help guide strands 80 into trenches 134 during the attachment process. With this type of arrangement, solder 142 may be placed on pads 40 in trenches 134, and strands 80 of fabric 12 may be sandwiched between component 26 and thermoplastic structure 148. Thermoplastic structure 148 may be brought into contact with protective cover 130, forcing strands 80 into trenches 134. Heat may then be applied to reflow solder 142 and melt thermoplastic 148 in trenches 134, thereby creating a robust mechanical and electrical connection between strand 80 and pad 40 (e.g., a connection of the type shown in FIGS. 28 and 33).

If desired, thermoplastic structure 148 and/or protective cover 130 may have a shape that helps contain solder 142 and strands 80 in trenches 134 during the attachment process. For example, thermoplastic structure 148 and/or protective cover 130 may form sloped sidewalls in trenches 134 or may have localized peaks surrounding trenches 134 to create deep recesses that are more difficult for solder 142 or strands 80 to escape during the attachment process.

Figure 36:
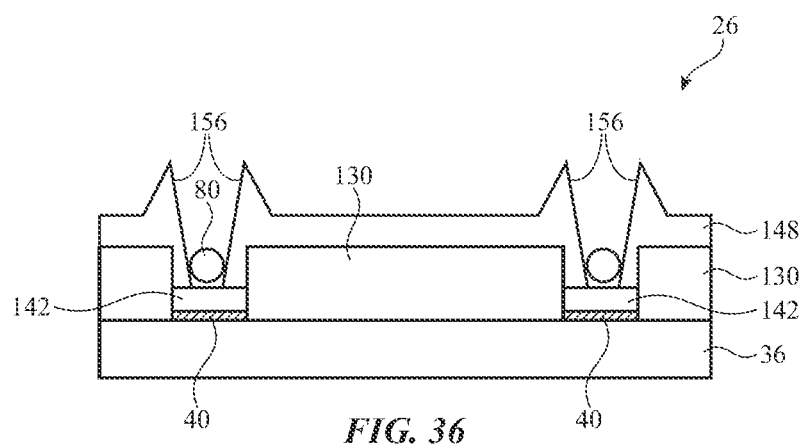
FIG. 36 is a side view of an illustrative component in which thermoplastic material has localized peaks around each trench to help prevent fabric strands from escaping the trenches during the attachment process in accordance with an embodiment.

As shown in FIG. 36, for example, thermoplastic 148 may have localized peaks 156 (e.g., raised portions) surrounding trench 134 to essentially increase the depth of trench 134 (e.g., so that the depth of trench 134 is greater than the thickness of protective cover 130). The increased depth of trenches 134 may help maintain solder 142 and strands 80 in trench 134 during the attachment process. When heat is applied to reflow solder 142 and melt plastic 148, peaks 156 may melt into trenches 134, resulting in a sealed electrical and mechanical connection between strands 80 and component 26 (e.g., a connection of the type shown in FIGS. 28 and 33).

FIGS. 37-43 show illustrative examples of trench geometries and pad sizes that may be used in component 26 to help attach component 26 to strands 80 of fabric 12. It should be understood that component 26 may have any suitable combination of features shown in FIGS. 37-43 (e.g., the trench shape of FIG. 39 may be used with the pad size of FIG. 38, etc.). The combinations of features shown are merely illustrative examples.

Figure 37:
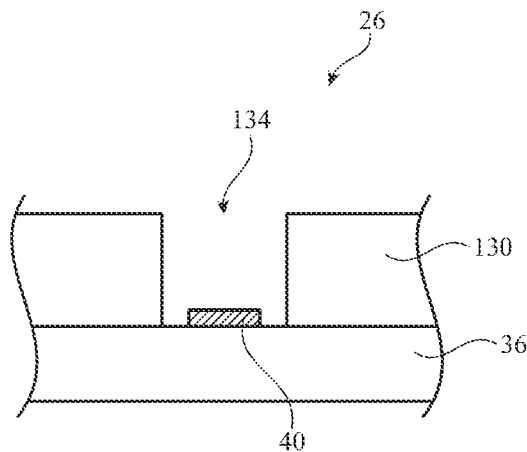
FIG. 37 is a side view of an illustrative component in which trenches in a protective cover have straight sidewalls in accordance with an embodiment.

In the example of FIG. 37, protective cover 130 forms straight sidewalls of trench 134 (e.g., sidewalls that extend perpendicular to the upper surface of interposer 36), and the width of pad 40 is smaller than the width of trench 134.

Figure 38:
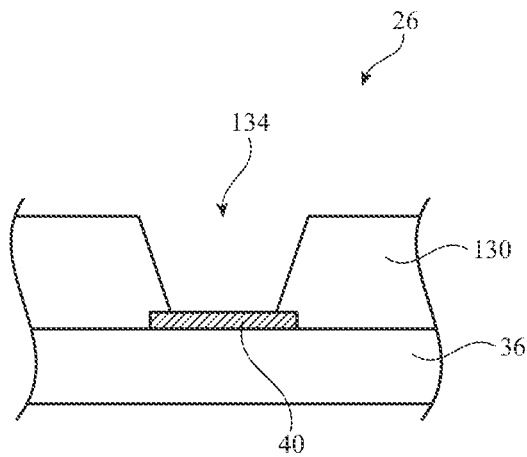
FIG. 38 is a side view of an illustrative component in which trenches in a protective cover have sloped sidewalls with a larger width at the top of the trench than at the bottom of the trench in accordance with an embodiment.

In the example of FIG. 38, protective cover 130 forms sloped sidewalls of trench 134, where the width of trench 134 may be smaller at the bottom of trench 134 than at the top of trench 134. The width of pad 40 may be greater than the width of the bottom of trench 134.

Figure 39:
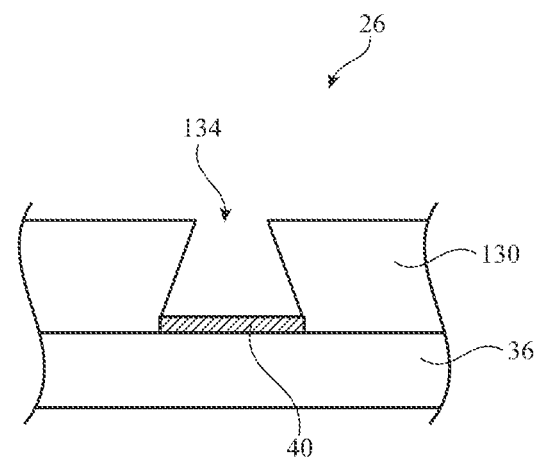
FIG. 39 is a side view of an illustrative component in which trenches in a protective cover have sloped sidewalls with a smaller width at the top of the trench than at the bottom of the trench in accordance with an embodiment.

In the example of FIG. 39, protective cover 130 forms sloped sidewalls of trench 134, where the width of trench 134 may be greater at the bottom of trench 134 than at the top of trench 134. The width of pad 40 may equal to the width of the bottom of trench 134. The reduced width of trench 134 at the top of trench 134 may help contain solder 142 and strand 80 in trench 134.

Figure 40:
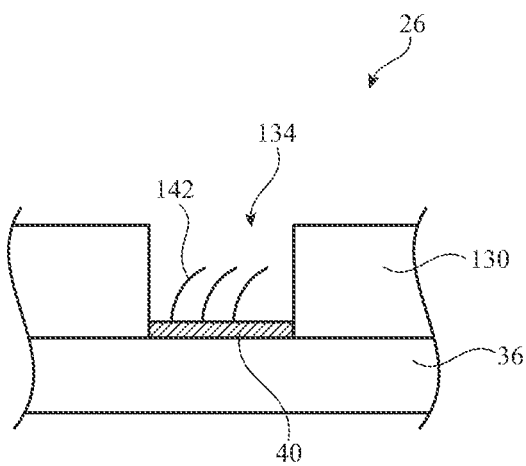
FIG. 40 is a side view of an illustrative component in which solder hooks promote coupling between the fabric strands and the solder in accordance with an embodiment.

In the example of FIG. 40, solder 142 has a shape that helps "grab" strands 80 to keep strands 80 in trenches 134 during the attachment process. Solder 142 may, for example, have the shape of barbs, hooks, spurs, spikes, or other suitable shape. When heat is applied to reflow solder 142, solder 142 may consolidate into a bead-like shape that surrounds strands 80.

Figure 41:
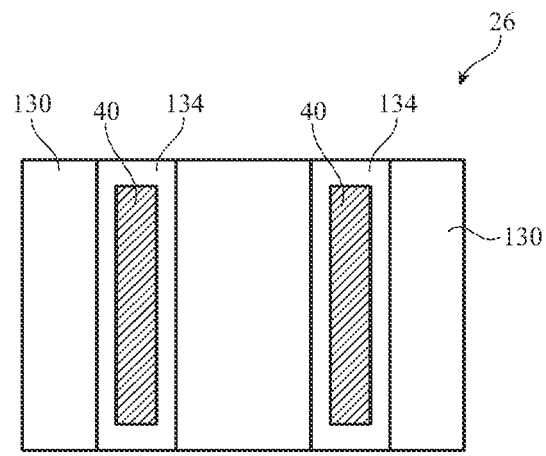
FIG. 41 is a bottom view of an illustrative component in which trenches in a protective cover have uniform width across the protective cover in accordance with an embodiment.
Figure 42:
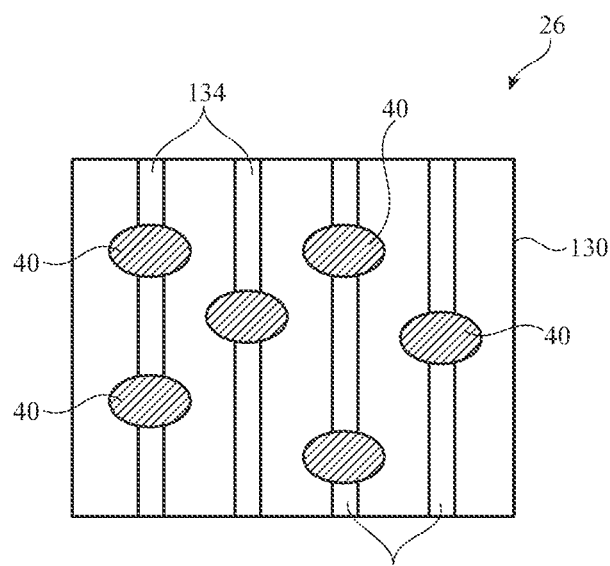
FIG. 42 is a bottom view of an illustrative component in which trenches in a protective cover have locally widened portions that are staggered relative to one another to accommodate larger pads in accordance with an embodiment.
Figure 43:
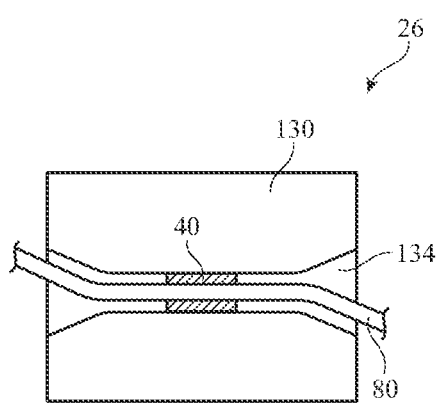
FIG. 43 is a bottom view of an illustrative component in which trenches in a protective cover have locally widened portions at the outer edges of the protective cover to accommodate bends in fabric strands in accordance with an embodiment.

FIGS. 41-43 show bottom views of protective cover 130 having various trench shapes and pad arrangements.

In the example of FIG. 41, trenches 134 have a straight shape and uniform width across protective cover 130. Each pad 40 may have an elongated shape in trenches 134, creating a large area with which to attach strands 80 to pads 40.

In the example of FIG. 42, trenches 134 have locally widened portions to accommodate larger pads 40. The use of locally widened portions may help contain solder 142 on pad 40. For example, the reduced width of trench 134 outside of the regions where pads 40 are located may help prevent solder from straying from pad 40. If desired, a solder mask may be used in regions of trenches 134 without pads 40 to help prevent solder 142 from reaching those areas. FIG. 42 also shows how pads 40 and locally widened portions of trenches 134 may be staggered relative to one another. By staggering pads 40, the width of trenches 134 may be increased to accommodate larger pads 40. This type of arrangement may also allow for a greater density of pads 40 on component 26 and a smaller strand-to-strand pitch.

FIG. 43 shows an example in which the width of trench 134 is wider at the outer edges of protective cover 130 than at the center of protective cover 130. The locally widened portions of trench 134 at the edges of protective cover 130 may allow strand 80 to bend or change direction gradually as it exits trench 134 and prevent sharp corners of protective cover 130 from damaging strand 80.

The foregoing is merely illustrative and various modifications can be made by those skilled in the art without departing from the scope and spirit of the described embodiments. The foregoing embodiments may be implemented individually or in any combination.

What is claimed is:

1. An item, comprising:
    fabric formed from strands including at least first and second conductive strands;
    an electrical component having a substrate with first and second opposing surfaces and an electrical device mounted to the first surface of the substrate; and
    a protective structure that encapsulates the electrical device, wherein the protective structure has first and second grooves and wherein the first and second conductive strands are electrically coupled to the electrical component within the first and second grooves.

2. The item defined in claim 1 wherein the protective structure is transparent.

3. The item defined in claim 2 wherein the electrical device emits light through the protective structure.

4. The item defined in claim 3 wherein the electrical device comprises a light-emitting diode.

5. The item defined in claim 1 wherein the fabric comprises insulating strands that are woven with the first and second conductive strands.

6. The item defined in claim 1 wherein the substrate comprises a printed circuit substrate.

7. The item defined in claim 6 further comprising first and second contact pads on the printed circuit substrate.

8. The item defined in claim 7 wherein the first and second conductive strands are respectively soldered to the first and second contact pads in the first and second grooves.

9. The item defined in claim 1 wherein the protective structure comprises thermoplastic material.

10. The item defined in claim 1 wherein the fabric has a pocket and the electrical component is located in the pocket.

11. An item, comprising:
    fabric formed from strands including at least one conductive strand;
    an electrical component having a printed circuit substrate and a contact pad; and
    an encapsulation structure that encapsulates at least part of the electrical component and that has a recess, wherein the conductive strand is electrically coupled to the contact pad in the recess.

12. The item defined in claim 11 wherein the encapsulation structure comprises thermoplastic material.

13. The item defined in claim 11 wherein the electrical component comprises a via.

14. The item defined in claim 11 wherein the encapsulation structure is transparent and the electrical component comprises a light-emitting diode that emits light through the encapsulation structure.

15. The item defined in claim 11 further comprising solder that electrically couples the conductive strand to the contact pad.

16. An item, comprising:
   fabric formed from strands including at least first and second conductive strands;
   an electrical component; and
   a transparent protective structure that at least partially encapsulates the electrical component, wherein the electrical component emits light through the protective structure and wherein the first and second conductive strands are at least partially embedded within the transparent protective structure.

17. The item defined in claim 16 wherein the fabric comprises woven fabric and wherein the strands include insulating strands woven with the first and second conductive strands.

18. The item defined in claim 16 wherein the electrical component has first and second contact pads and wherein the first and second conductive strands are respectively soldered to the first and second contact pads.

19. The item defined in claim 16 wherein the electrical component comprises a light-emitting diode.

20. The item defined in claim 16 wherein the transparent protective structure has first and second recesses and wherein the first and second conductive strands are at least partially located within the first and second recesses.

* * * * *